US012702053B2

(12) United States Patent
Chen et al.

(10) Patent No.: US 12,702,053 B2
(45) Date of Patent: Aug. 4, 2026

(54) PACKAGE STRUCTURE AND METHOD OF MANUFACTURING THE SAME

(71) Applicant: Taiwan Semiconductor Manufacturing Company, Ltd., Hsinchu (TW)

(72) Inventors: Wei-Chih Chen, Taipei City (TW); Hung-Jui Kuo, Hsinchu City (TW); Yu-Hsiang Hu, Hsinchu City (TW); Sih-Hao Liao, New Taipei City (TW); Hung-Chun Cho, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 885 days.

(21) Appl. No.: 17/857,041

(22) Filed: Jul. 4, 2022

(65) Prior Publication Data

US 2022/0336310 A1 Oct. 20, 2022

Related U.S. Application Data

(63) Continuation of application No. 17/006,876, filed on Aug. 30, 2020, now Pat. No. 11,417,582.

(51) Int. Cl.
*H10W 74/10* (2026.01)
*H10W 70/09* (2026.01)
(Continued)

(52) U.S. Cl.
CPC ......... *H10W 74/147* (2026.01); *H10W 70/09* (2026.01); *H10W 90/701* (2026.01); *H10W 70/6528* (2026.01)

(58) Field of Classification Search
CPC ......... H01L 23/10; H01L 24/18; H01L 24/65; H01L 2224/28; H01L 2224/20;
(Continued)

(56) References Cited

U.S. PATENT DOCUMENTS 9,000,584 B2 4/2015 Lin et al.
9,048,222 B2 6/2015 Hung et al.
(Continued)

OTHER PUBLICATIONS

Ghanem, Amyl & Lang, Yujie. (2017). Introduction to polymer adhesion. (Year: 2017).*
T. Matsumae, M. Fujino, K. Zhang, H. Baumgart and T. Suga, “Bonding of polymer and glass using nano-adhesion layer for flexible electronics,” 2015 10th International Microsystems, Packaging, Assembly and Circuits Technology Conference (IMPACT), Taipei, Taiwan, 2015, pp. 180-183 (Year: 2015).*

*Primary Examiner* — Julio J Maldonado
*Assistant Examiner* — Paul A Berry
(74) *Attorney, Agent, or Firm* — JCIPRNET

(57) ABSTRACT

A package structure includes a semiconductor die, an insulating encapsulation, a first redistribution circuit structure and a surface-modifying film. The semiconductor die has conductive terminals. The insulating encapsulation laterally encapsulates the semiconductor die and exposes the conductive terminals. The first redistribution circuit structure is located over the insulating encapsulation and electrically connected to the semiconductor die. The surface-modifying film is located on the insulating encapsulation and has a plurality of openings exposing edges of the conductive terminals, wherein the surface-modifying film separates the first redistribution circuit structure from the insulating encapsulation.

20 Claims, 25 Drawing Sheets

(51) Int. Cl.
*H10W 70/652* (2026.01)
*H10W 90/00* (2026.01)

(58) Field of Classification Search
CPC ....... H01L 2224/22505; H01L 2224/22; H01L 2224/221; H01L 2224/2205; H01L 2224/2201; H01L 2224/215; H01L 24/96; H01L 2224/96; H01L 24/20; H01L 2224/214; H01L 24/13; H01L 24/16; H01L 24/29; H01L 24/32; H01L 24/76; H01L 21/76841; H01L 23/3135; H01L 25/112; H01L 25/105; H01L 2224/02331; H01L 2224/1319–13191; H01L 21/76822; H01L 21/76826; H01L 21/76829; H01L 21/76831; C09D 143/04; C09D 183/00; H10W 42/101; H10W 42/276; H10W 72/01215; H10W 72/01233; H10W 72/222; H10W 72/245; H10W 72/255; H10W 72/9413; H10W 72/9415; H10W 74/012; H10W 74/114; H10W 74/121; H10W 74/127; H10W 74/134; H10W 74/15; H10W 74/40

See application file for complete search history.

(56) References Cited

U.S. PATENT DOCUMENTS

| | | | | |
|---|---|---|---|---|
| 9,048,233 | B2 * | 6/2015 | Wu | H01L 21/486 |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2009/0020864 | A1 * | 1/2009 | Pu | H10W 74/019 257/E23.129 |
| 2010/0200995 | A1 * | 8/2010 | Monnoyer | H01L 21/02343 118/500 |
| 2016/0343695 | A1 * | 11/2016 | Lin | H01L 23/528 |
| 2017/0018732 | A1 * | 1/2017 | Mandlik | C23C 16/02 |
| 2017/0110421 | A1 * | 4/2017 | Liu | H01L 25/50 |
| 2019/0006283 | A1 * | 1/2019 | Wang | H01L 23/5386 |
| 2019/0206841 | A1 * | 7/2019 | Kim | H01L 25/0657 |

* cited by examiner

PACKAGE STRUCTURE AND METHOD OF MANUFACTURING THE SAME

CROSS-REFERENCE TO RELATED APPLICATION

This application is a continuation application of and claims the priority benefit of a prior application Ser. No. 17/006,876, filed on Aug. 30, 2020, now allowed. The entirety of the above-mentioned patent application is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging (e.g. formations of a redistribution circuit structure/layer and an encapsulant) for ensuring the reliability of packages. In addition, such packages may further be integrated to a semiconductor substrate a circuit structure (e.g. formations of conductive layers and a dielectric layers) after dicing.

In these semiconductor package applications, heat causes components of the package to expand at their respective coefficients of thermal expansion (CTE) during operation. It is tensile stress concentration that develops due to the CTE mismatch between the components. For example, crack or break under thermal stress may occur at the interface of the redistribution circuit structure/layer and the encapsulant in one package or at the interface of the dielectric layers having different materials in the semiconductor substrate, so that a circuit failure and/or warpage result.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
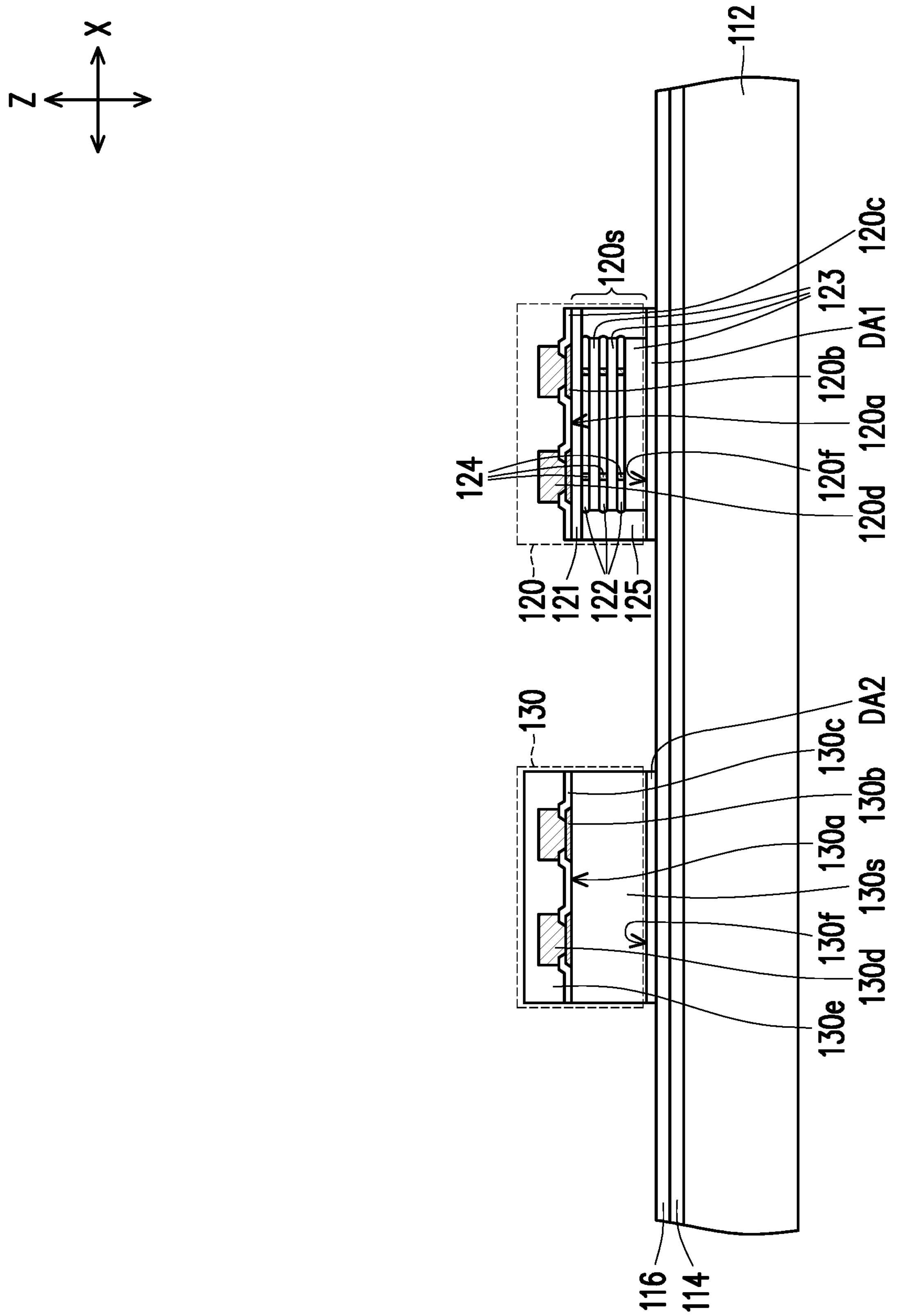
FIG. 1 through FIG. 15 are schematic cross-sectional views of various stages in a manufacturing method of a package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as “first”, “second”, “third”, “fourth”, “fifth” and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC devices, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 22A:
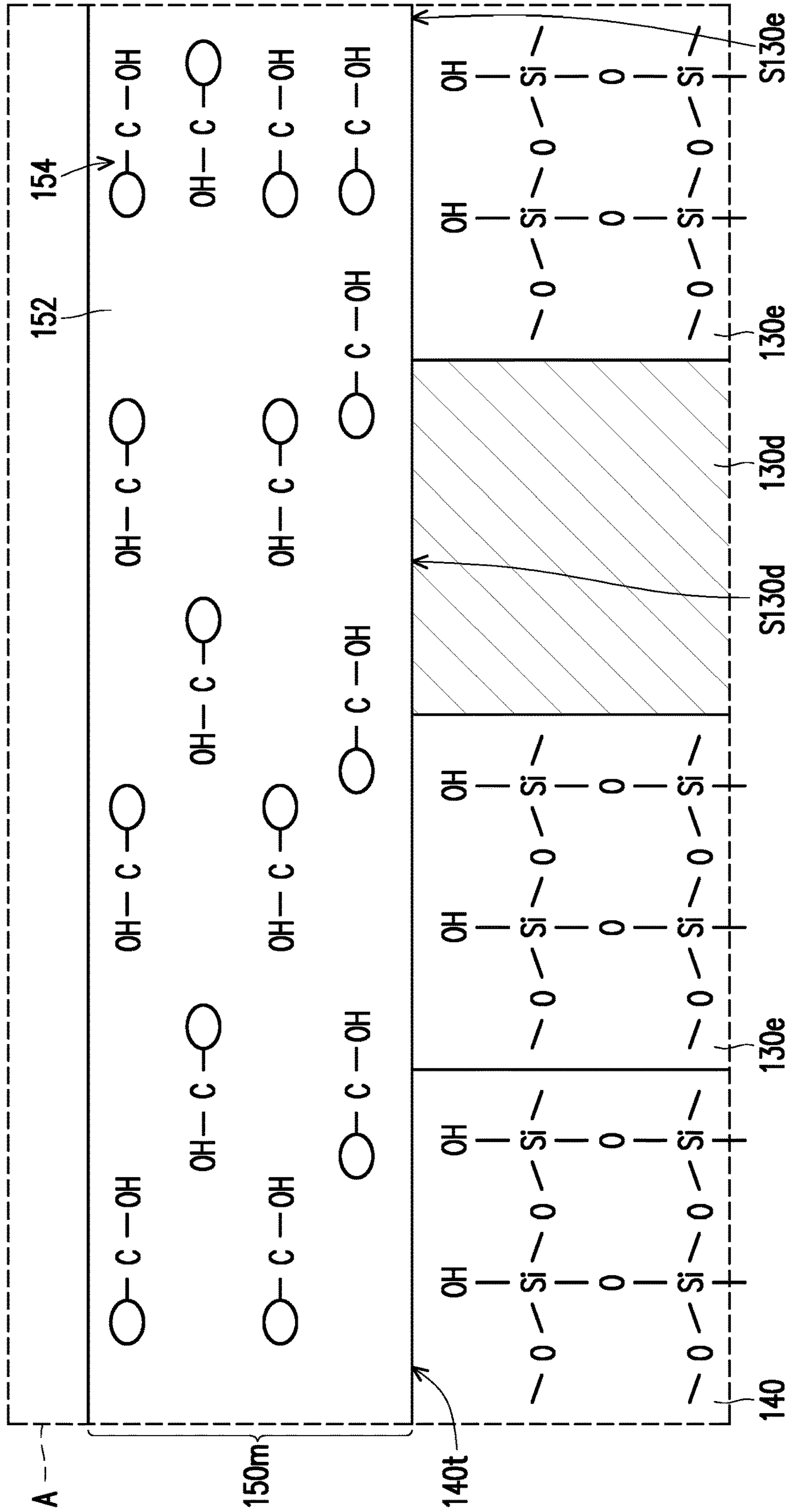
FIG. 22A and FIG. 22B illustrate a chemical mechanism at an interface of a modifying material/layer and a dielectric material/layer under a thermal treatment in accordance with some embodiments of the present disclosure.
Figure 22B:
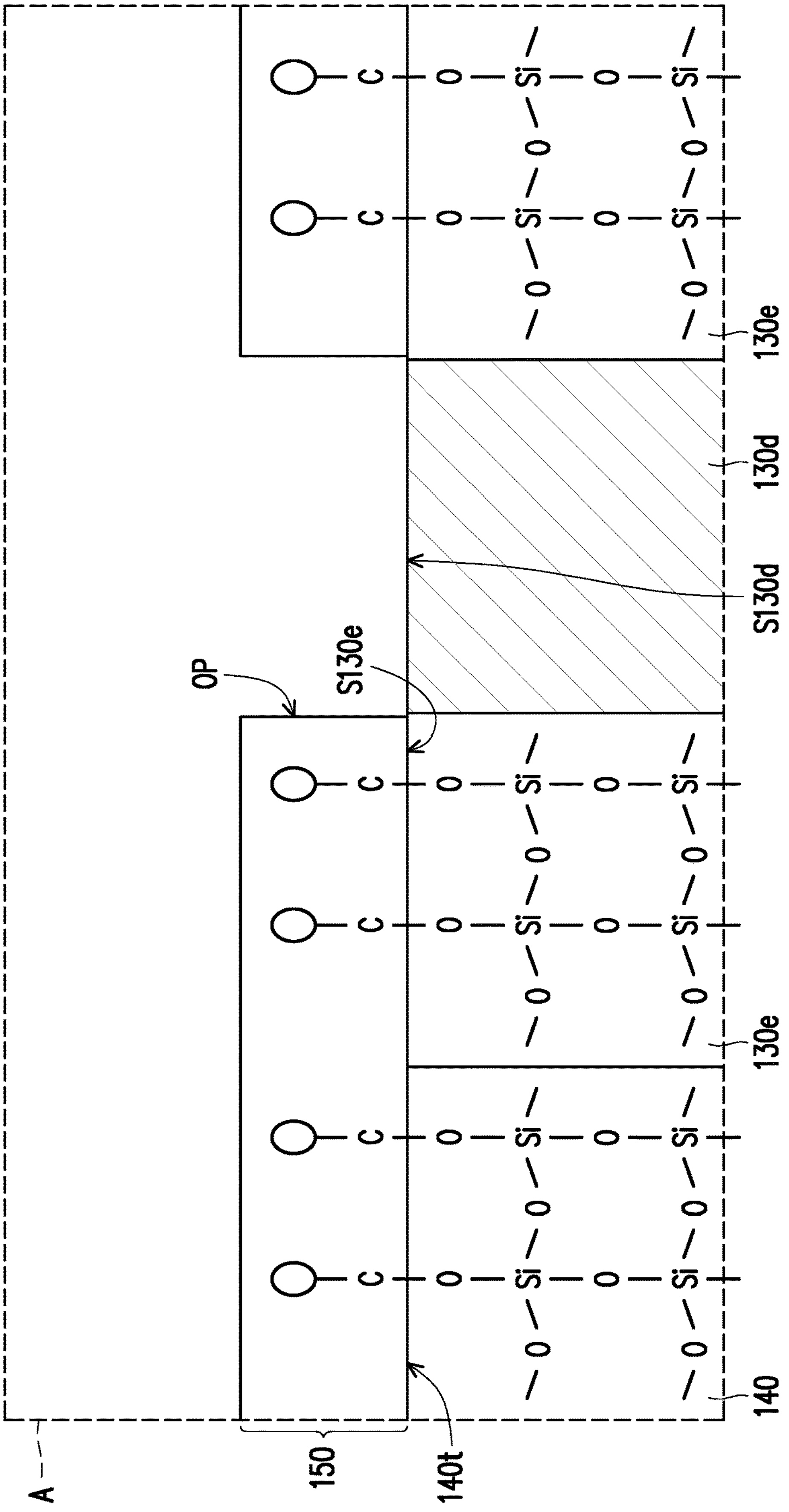
Figure 23A:
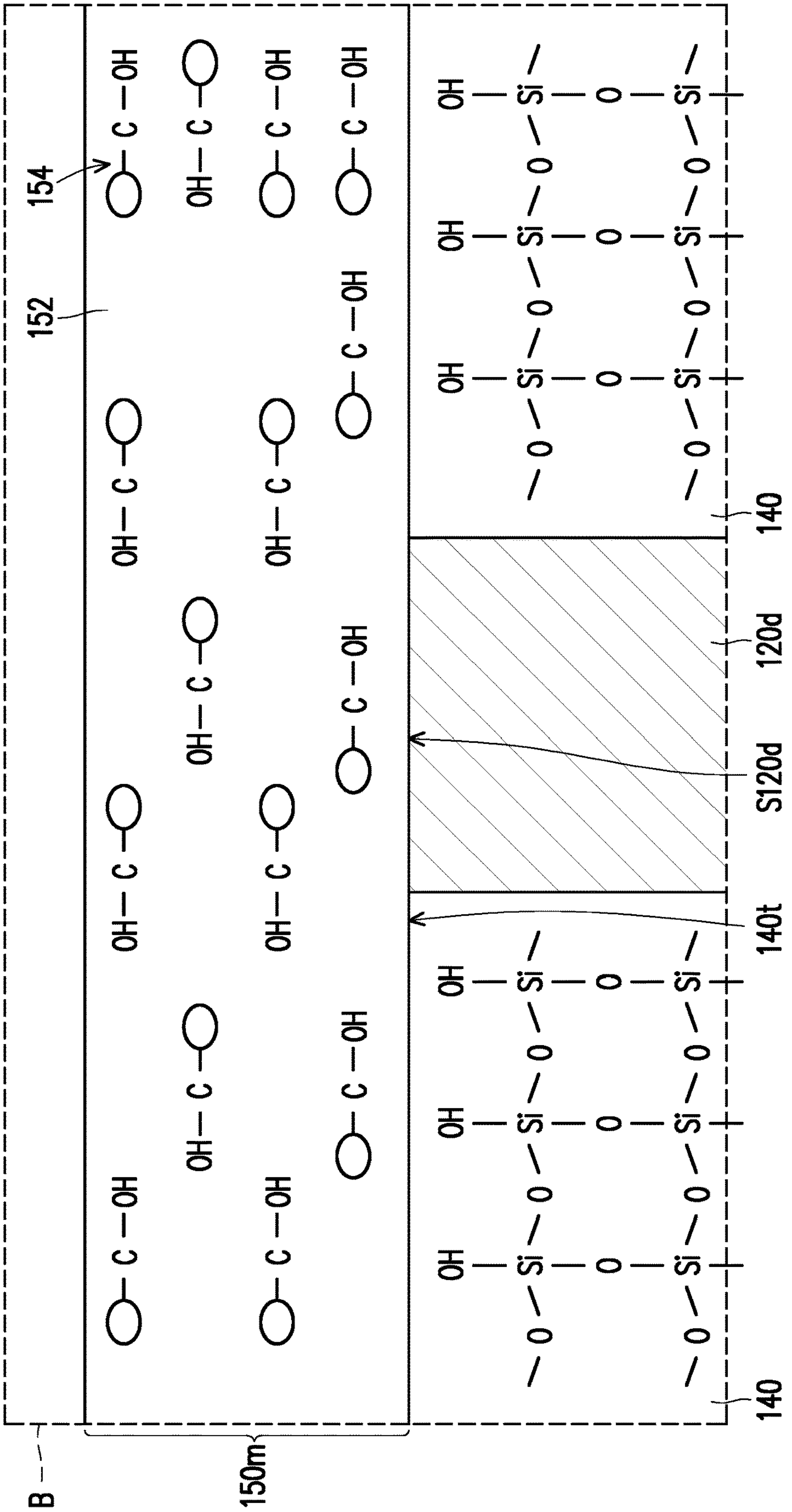
FIG. 23A and FIG. 23B illustrate a chemical mechanism at an interface of a modifying material/layer and a dielectric material/layer under a thermal treatment in accordance with some embodiments of the present disclosure.
Figure 23B:
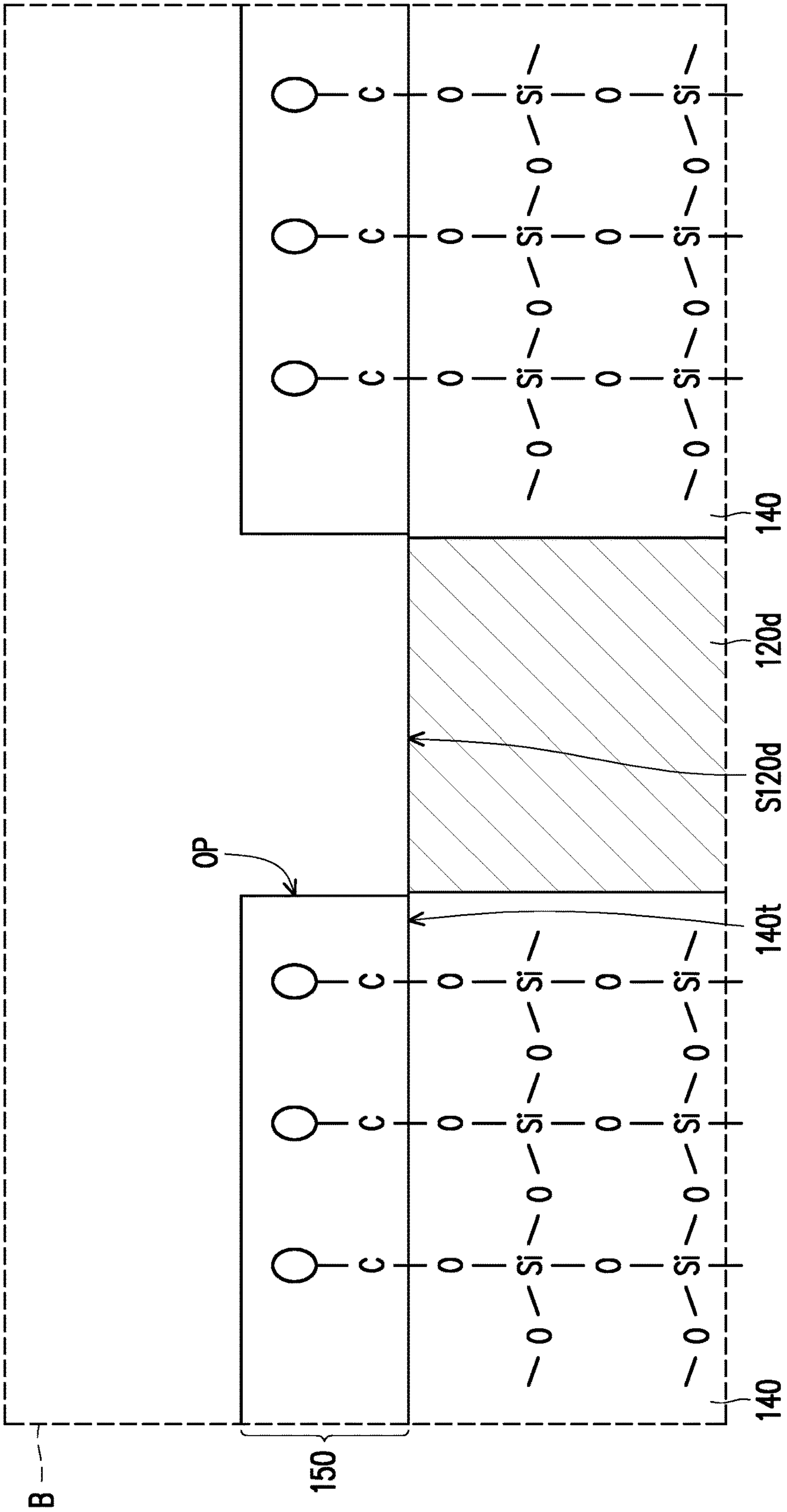

FIG. 1 through FIG. 15 are schematic cross-sectional views of various stages in a manufacturing method of a package structure in accordance with some embodiments of the disclosure. FIG. 16A and FIG. 16B are respectively an enlarged, schematic cross-sectional view of a portion of a package structure in accordance with some embodiments of the disclosure. FIG. 22A and FIG. 22B illustrate a chemical mechanism at an interface of a modifying material/layer and a dielectric material/layer under a thermal treatment in accordance with some embodiments of the present disclosure. FIG. 23A and FIG. 23B illustrate a chemical mechanism at an interface of a modifying material/layer and a dielectric material/layer under a thermal treatment in accordance with some embodiments of the present disclosure. In some embodiments, the manufacturing method is part of a packaging process. In FIG. 1 to FIG. 15, more than one (semiconductor) chips or dies are shown to represent plural (semiconductor) chips or dies of the wafer, and one (semiconductor) package structure is shown to represent plural (semiconductor) package structures obtained following the (semiconductor) manufacturing method, however the disclosure is not limited thereto. In other embodiments, one (semiconductor) chip or die are shown to represent plural (semiconductor) chips or dies of the wafer, and one or more than one (semiconductor) package structure are shown to represent plural (semiconductor) package structures obtained following the (semiconductor) manufacturing method.

Referring to FIG. 1, in some embodiments, a carrier 112 with a debond layer 114 and a buffer layer 116 coated thereon is provided. In one embodiment, the carrier 112 may be a glass carrier or any suitable carrier for carrying a semiconductor wafer or a reconstituted wafer for the manufacturing method of a (semiconductor) package structure. In some embodiments, the carrier 112 may have a round top-view shape, and may have a size of a silicon wafer.

In some embodiments, the debond layer 114 is in physical contact with the illustrated top surface of the carrier 112, and may be formed by a suitable fabrication technique such as coating, lamination, or deposition. In some embodiments, the material of the debond layer 114 may be any material suitable for bonding and de-bonding the carrier 112 from the above layer(s) (e.g. the buffer layer 116) or any wafer(s) disposed thereon. In some embodiments, the debond layer 114 may include a dielectric material layer made of a dielectric material including any suitable polymer-based dielectric material (such as benzocyclobutene (BCB), polybenzoxazole (PBO)). In an alternative embodiment, the debond layer 114 may include a dielectric material layer made of an epoxy-based thermal-release material, which loses its adhesive property when heated, such as a light-to-heat-conversion (LTHC) release coating film. In a further alternative embodiment, the debond layer 114 may include a dielectric material layer made of an ultra-violet (UV) glue, which loses its adhesive property when exposed to UV lights.

In certain embodiments, the debond layer 114 may be dispensed as a liquid and cured (e.g., a heat curable adhesive layer) or may be a laminate film laminated onto the carrier 112, or may be the like. In some embodiments, the illustrated top surface of the debond layer 114, which is opposite to the illustrated bottom surface contacting the carrier 112, may be levelled and may have a high degree of planarity, but the disclosure is not limited thereto. In certain embodiments, the debond layer 114 is, for example, a LTHC release layer with good chemical resistance, and such layer enables room temperature de-bonding from the carrier 112 by applying laser irradiation, however the disclosure is not limited thereto.

In some embodiments, the buffer layer 116 is disposed on the debond layer 114. In some embodiments, the buffer layer 116 is in physical contact with the illustrated top surface of the debond layer 114, and the debond layer 114 is located between the carrier 112 and the buffer layer 116. In some embodiments, the buffer layer 116 may be a dielectric material layer.

In some embodiments, the buffer layer 116 may be formed by a suitable fabrication technique such as coating, lamination, or deposition. In some embodiments, the buffer layer 116 is, for example, polymer such as polyimide (PI), BCB, PBO, or any other suitable polymer-based dielectric material. In some alternative embodiments, the buffer layer 116 may include non-organic dielectric materials such as silicon oxide, silicon nitride, silicon carbide, silicon oxynitride, or the like. In some embodiments, the buffer layer 116 may be Ajinomoto buildup film (ABF), solder resist film (SR), or the like. It should be noted that the materials of the debond layer 114, the carrier 112 and the buffer layer 116 are merely for illustration, and the disclosure is not limited thereto. The illustrated top surface of the buffer layer 116, which is opposite to the illustrated bottom surface contacting the debond layer 114, may be levelled and may have a high degree of planarity. However, the disclosure is not limited thereto; in other embodiments, the buffer layer 116 may be omitted.

In some embodiments, at least one semiconductor die is provided. As shown in FIG. 1, for example, a semiconductor die 120 and a semiconductor die 130 are provided and disposed over the carrier 112. In some embodiments, the semiconductor die 120 and the semiconductor die 130 are picked and placed over the carrier 112 and disposed on the buffer layer 116. For example, as shown in FIG. 1, the semiconductor dies 120 and 130 are arranged aside to each other along a direction X, and the direction X is perpendicular to a stacking direction Z of the carrier 112, the debond layer 114, the buffer layer 116 and the semiconductor dies 120, 130. In the disclosure, it should be appreciated that the illustration of the semiconductor dies 120, 130 and other components throughout all figures is schematic and is not in scale.

As illustrated in FIG. 1, in some embodiments, the semiconductor die 120 includes a die stack **120*s* having an active surface 120*a* and a backside surface 120*f* opposite to the active surface 120*a*, a plurality of pads 120*b* distributed on the active surface 120*a*, a passivation layer 120*c* covering the active surface 120*a* and a portion of the pads 120*b*, and a plurality of conductive vias 120*d* connecting to the pads 120*b* exposing by the passivation layer 120*c*. The pads 120*b*, the passivation layer 120*c* and the conductive vias 120*d* are formed on the die stack 120*s*. The pads 120*b* are partially exposed by the passivation layer 120*c*, and the conductive vias 120*d* are respectively disposed on and electrically connected to the pads 120*b***.

The pads **120*b* are aluminum pads or other suitable metal pads, for example. In some embodiments, the passivation layer 120*c* a may be a PBO layer, a PI layer or other suitable polymers. In some alternative embodiments, the passivation layer 120*c* may be made of inorganic materials, such as silicon oxide, silicon nitride, silicon oxynitride, or any suitable dielectric material. The conductive vias 120*d*** are copper pillars, copper alloy pillar or other suitable metal pillars containing copper metal, for example.

The die stack **120*s* may include a base tier and at least one inner tier stacked thereon. As shown in FIG. 1, for example, the die stack 120*s* includes a carrier die 121, a plurality of dielectric films 122, a plurality of dies 123, a plurality of conductive vias 124 and an encapsulant 250, where the dies 123 are sequentially disposed on the carrier die 121 along the direction Z, and the conductive vias 124 are grouped into different groups to electrically connect two adjacent and overlapping dies of the carrier die 121 and the dies 123. In some embodiments, the different groups of the conductive vias 124 are independently covered by a respective one of the dielectric films 122, and a surface of the carrier die 121 exposed by the dielectric films 122 and the dies 123, sidewalls of the dielectric films 122 and sidewalls of the dies 123 are covered by the encapsulant 250. As shown in FIG. 1, in some embodiments, the conductive vias 124 are separated from the encapsulant 250 by the dielectric films 122. For example, the carrier die 121 is referred to as a base tier of the die stack 120*s* while the each of the dies 123 is referred to as a stacking tier or an inner tier of the die stack 120*s*. As illustrated in FIG. 1, for example, the carrier die 121 (e.g., the base tier) of the die stack 120*s* is electrically connected to the conductive vias 120*d* through the pads 120*b*, where the conductive vias 120*d* are referred to as conductive terminals of the semiconductor die 120 for electrical connection to external components. The number of the carrier die 121 included in the base tier and the number of the dies 123** included in each inner tier are, independently, not limited to the disclosure, and may be one or more than one based on the demand and design layout.

It is noted that, each of the carrier die 121 and the dies 123 may further include an interconnect structure (not shown), conductive pads (not shown), a passivation layer (not shown), and a post-passivation layer (not shown). The carrier die 121 described herein may be referred as a semiconductor chip or an integrated circuit (IC). In some embodiments, the carrier die 121 includes one or more digital chips, analog chips or mixed signal chips, such as an application-specific integrated circuit ("ASIC") chips, a sensor chip, a wireless and radio frequency (RF) chip, a logic chip or a voltage regulator chip. The logic chip may be a central processing unit (CPU), a graphics processing unit (GPU), a system-on-a-chip (SoC), a microcontroller, or the like. In some embodiments, each of the dies 123 includes a memory die (e.g., a D dynamic random-access memory (DRAM) die, static random-access memory (SRAM) die, a synchronous dynamic random-access memory (SDRAM), a NAND flash, etc.). That is to say, the semiconductor die 120 includes a hybrid memory cube (HMC) module, a high bandwidth memory (HBM) module, or the like; in some embodiments. For example, the dies 123 in the die stack **120*s* of the semiconductor die 120 may be high bandwidth memory (HBM) dies, and the carrier die 121** may be a logic die providing control functionality for these memory dies.

In some embodiments, the dielectric films 122 independently includes a PBO layer, a PI layer or other suitable polymers. In some alternative embodiments, a material of the dielectric films 122 includes an inorganic material, such as silicon oxide, silicon nitride, silicon oxynitride, or any suitable dielectric material. The dielectric films 122 may be formed by suitable fabrication techniques such as spin-on coating, chemical vapor deposition (CVD), (e.g. plasma-enhanced chemical vapor deposition (PECVD)), or the like. Alternatively, the dielectric films 122 each are, for example, a non-conductive film (NCF) which can be formed by lamination. The conductive vias 124 are copper pillars, copper alloy pillar or other suitable metal pillars containing copper metal, for example.

In some embodiments, the material of the encapsulant 125 includes a molding compound, a molding underfill, a resin (such as epoxy), or the like. In some alternative embodiments, the material of the encapsulant 125 includes nitride such as silicon nitride, oxide such as silicon oxide, phosphosilicate glass (PSG), borosilicate glass (BSG), boron-doped phosphosilicate glass (BPSG), a combination thereof, or the like. In yet alternative embodiments, the material of each of the encapsulant 125 includes an organic material (e.g., epoxy, PI, PBO, or the like), or the mixture of inorganic and organic materials (e.g., the mixture of silicon oxide and epoxy, or the like). In some embodiments, the encapsulant 125 may be formed by a molding process, such as a compression molding process. In some alternative embodiments, the encapsulant 125 may be formed through suitable fabrication techniques such as CVD (e.g., high-density plasma chemical vapor deposition (HDPCVD) or PECVD). As illustrated in FIG. 1, for example, the backside surface **120*f* of the semiconductor die 120 includes a surface of the encapsulant 125 and a surface of the die 123 included in an outmost tier of the inner tiers in the die stack 120*s*, where the surface of the die 123 included in the outmost tier and the surface of the encapsulant 125** are substantially leveled with and coplanar to each other.

As illustrated in FIG. 1, in some embodiments, the semiconductor die 130 includes a semiconductor substrate **130*s* having an active surface 130*a* and a backside surface 130*f* opposite to the active surface 130*a*, a plurality of pads 130*b* distributed on the active surface 130*a*, a passivation layer 130*c* covering the active surface 130*a* and a portion of the pads 130*b*, a plurality of conductive vias 130*d* connecting to the pads 130*b* exposing by the passivation layer 130*c*, and a protection layer 130*e* disposed on the conductive vias 130*d*. The pads 130*b*, the passivation layer 130*c*, the conductive vias 130*d*, and the protection layer 130*e* are formed on the semiconductor substrate 130*s*. The pads 130*b* are partially exposed by the passivation layer 130*c*, the conductive vias 130*d* are respectively disposed on and electrically connected to the pads 130*b*, and the protection layer 130*e* covers the passivation layer 130*c* exposed by the conductive vias 130*d* and the conductive vias 130*d***.

However, the disclosure may not be limited thereto. For example, the conductive vias **130*d* and the protection layer 130*e* may be omitted. In an alternative embodiment, the semiconductor die 130 may include the semiconductor substrate 130*s* having the active surface 130*a* and the backside surface 130*f* opposite to the active surface 130*a*, the plurality of pads 130*b* distributed on the active surface 130*a*, and the passivation layer 130*c* covering the active surface 130*a* and a portion of the pads 130*b***.

The material of the semiconductor substrate **130*s* may include a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components may be formed in a front-end-of-line (FEOL) process. In an alternative embodiment, the semiconductor substrate 130*s*** may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In addition, the semiconductor substrate **130*s* may further include an interconnection structure (not shown) disposed on the active surface 130*a*. In certain embodiments, the interconnection structure may include one or more inter-dielectric layers and one or more patterned conductive layers stacked alternately for providing routing function to the active components and the passive components embedded in the semiconductor substrate 130***s*, where the pads 130*b* may be referred to as an outermost layer of the patterned conductive layers. In one embodiment, the interconnection structure may be formed in a back-end-of-line (BEOL) process. For example, the inter-dielectric layers may be silicon oxide layers, silicon nitride layers, silicon oxy-nitride layers, or dielectric layers formed by other suitable dielectric materials, and the inter-dielectric layers may be formed by deposition or the like. For example, the patterned conductive layers may be patterned copper layers or other suitable patterned metal layers, and the patterned conductive layers may be formed by electroplating or deposition. However, the disclosure is not limited thereto.

The pads 130*b* are aluminum pads or other suitable metal pads, for example. The conductive vias 130*d* are copper pillars, copper alloy pillar or other suitable metal pillars containing copper metal, for example. In some embodiments, the passivation layer 130*c* and the protection layer 130*e* may be a PBO layer, a PI layer or other suitable polymers. In some alternative embodiments, the passivation layer 130*c* and the protection layer 130*e* may be made of inorganic materials, such as silicon oxide, silicon nitride, silicon oxynitride, or any suitable dielectric material. In one embodiment, the material of the protection layer 130*e* can be the same as the material of the passivation layer 130*c*. However, the disclosure is not limited thereto; alternatively, the material of the protection layer 130*e* may be different from the material of the passivation layer 130*c*, where the material of the protection layer 130*e* facilitates the formation of a surface-modifying film 150 later formed in conjunction with FIG. 4 and FIG. 5. For example, the protection layer 130*e* includes a modified material having a chemical structure having —Si—O—Si— bond therein and a —Si—OH group at terminals thereof, where the modified material may be obtained by modifying a non-modified material by an additive. In some embodiments, the non-modified material includes polymers such as PBO or PI, where the additive includes a surfactant such as a zwitterionic surfactant having silicon atoms, titanium atoms, or the like. In some embodiments, based on a total amount of the modified material used for the protection layer 130*e*, an amount of the non-modified material is approximately 90 wt % to 99.9 wt % and an amount of the additive is approximately 0.1 wt % to 10 wt %.

The semiconductor die 130 may be referred to as semiconductor dies or chips, independently, including a digital chip, analog chip or mixed signal chip. In some embodiments, the semiconductor die 130 is a logic die such as a CPU, a GPU, a neural network processing unit (NPU), a deep learning processing unit (DPU), a tensor processing unit (TPU), a SoC, an application processor (AP), and a microcontroller; a power management die such as a power management integrated circuit (PMIC) die; a wireless and radio frequency (RF) die; a baseband (BB) die; a sensor die such as a photo/image sensor chip; a micro-electro-mechanical-system (MEMS) die; a signal processing die such as a digital signal processing (DSP) die; a front-end die such as an analog front-end (AFE) dies; an application-specific die such as an application-specific integrated circuit (ASIC), a field-programmable gate array (FPGA), etc.); a combination thereof; or the like. In alternative embodiments, the semiconductor die 130 are, independently, an artificial intelligence (AI) engine such as an AI accelerator; a computing system such as an AI server, a high-performance computing (HPC) system, a high power computing device, a cloud computing system, an edge computing system, etc.; a combination thereof; or the like. The type of the semiconductor die 130 may be selected and designated based on the demand and design requirement, and thus are specifically limited in the disclosure.

As shown in FIG. 1, only one semiconductor die 120 and one semiconductor die 130 are presented for illustrative purposes, however, it should be noted that the number of the semiconductor die 120 and the number of the semiconductor die 130 may be, independently, one or more than one, the disclosure is not limited thereto. That is to say, the semiconductor die 120 may include a plurality of semiconductor dies 120, and/or the semiconductor die 130 may include a plurality of semiconductor dies 130. In the embodiments of which the number of the semiconductor die 120 is more than one, the semiconductor dies 120 can be the same types. Alternatively, the semiconductor dies 120 may be different types, in part or all. In the embodiments of which the number of the semiconductor die 130 is more than one, the semiconductor dies 130 can be the same types. Alternatively, the semiconductor dies 130 may be different types, in part or all.

In certain embodiments, one or more than one additional semiconductor die, except for the semiconductor dies 120 and 130, is further provided, where the additional semiconductor die(s) may be, independently, the same type or different types as comparing with the types of the semiconductor dies 120 and/or 130. The disclosure is not limited thereto.

Continued on FIG. 1, in some embodiments, the semiconductor dies 120, 130 are disposed on the buffer layer 116, where the backside surface 120*f* of the semiconductor die 120 and the backside surface 130*f* of the semiconductor die 130 are bonded to the buffer layer 116. In detail, the semiconductor dies 120, 130 are placed on the buffer layer 116 in a way that their backside surfaces (e.g., 120*f* and 130*f*) are attached (or adhered) to the buffer layer 116, for example. In some embodiments, the semiconductor dies 120, 130 are attached (or adhered) to the buffer layer 116 through bonding films DA1 and DA2, respectively. The bonding films DA1 and DA2 each may include an adhesive film, such as a die attach film (DAF) or a layer made of adhesives, epoxy-based resin, acrylic polymer, other suitable insulating material, or the like, and which may be with or without fillers filled therein (such as silica, alumina, or the like). The disclosure is not limited thereto. For example, the films DA1 and DA2 may be any materials used for fusion bonding. For example, the bonding films DA1 and DA2 may be an oxide-based film (e.g., silicon oxide film) used for oxide-oxide fusion bonding.

In some embodiments, the bonding film DA1 is located between the semiconductor die 120 and the buffer layer 116, and two opposite sides of the bonding film DA1 physically contacts the backside surface 120*f* of the semiconductor die 12 and the buffer layer 116. In some embodiments, the bonding film DA2 is located between the semiconductor die 130 and the buffer layer 116, and two opposite sides of the bonding film DA2 physically contacts the backside surface 130*f* of the semiconductor die 130 and the buffer layer 116. In some embodiments, due to the bonding films DA1 and DA2, the semiconductor die 120 and the semiconductor die 130 are stably adhered to the buffer layer 116.

Figure 2:
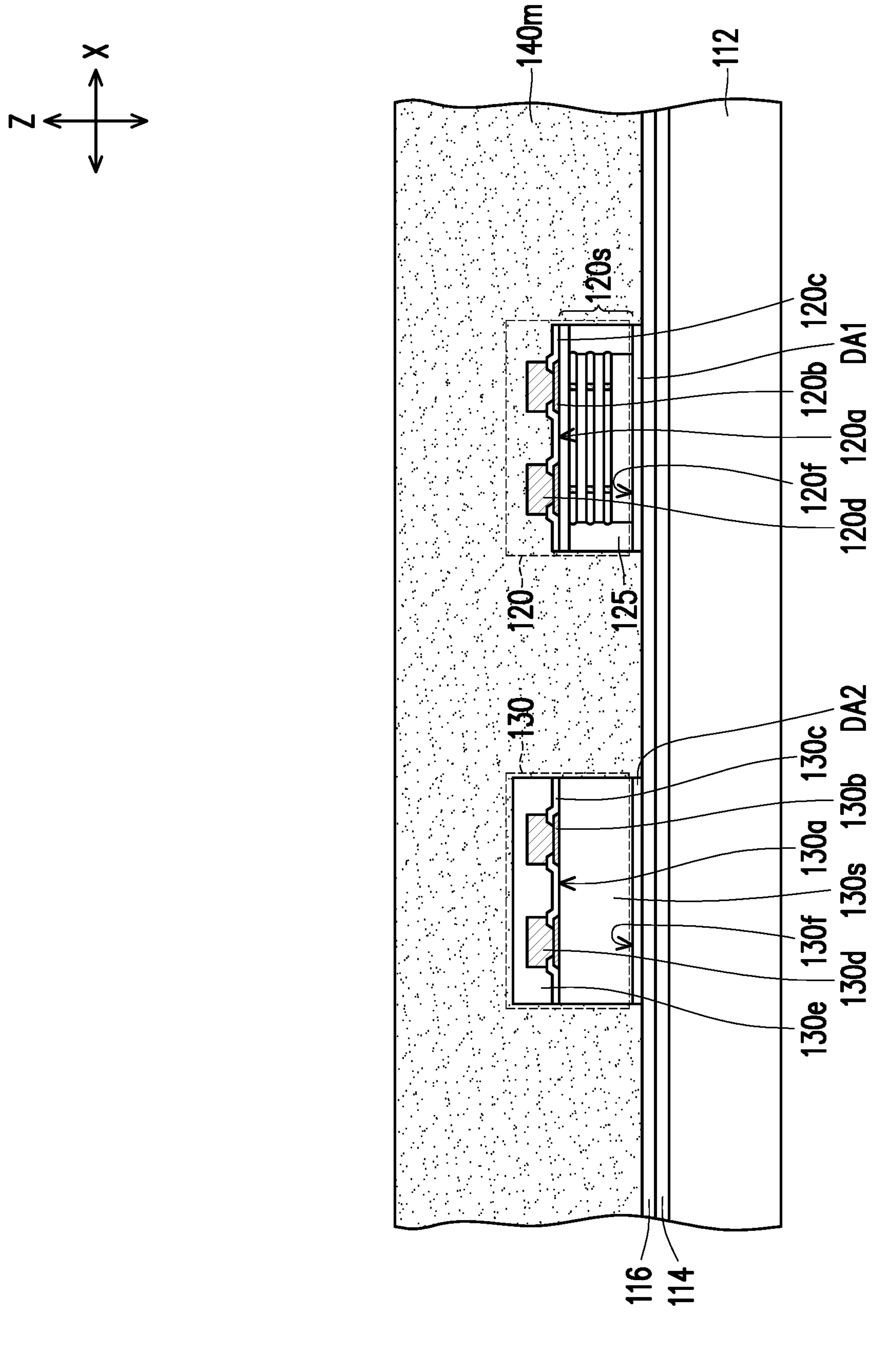

Referring to FIG. 2, in some embodiments, the semiconductor dies 120, 130 are encapsulated in an insulating encapsulation 140*m*. In some embodiments, the insulating encapsulation 140*m* is formed on the buffer layer 116 and over the carrier 112. As shown in FIG. 2, the insulating encapsulation 140*m* at least fills up the gaps between the semiconductor dies 120 and 130 and between the bonding films DA1 and DA2, for example. In some embodiments, the insulating encapsulation 140*m* covers the semiconductor dies 120, 130, the bonding films DA1, DA2 and the buffer layer 116 exposed by the semiconductor dies 120, 130 and the bonding films DA1, DA2. In other words, for example, the semiconductor dies 120, 130 are not accessibly revealed by and embedded in the insulating encapsulation 140*m*.

In some embodiments, the insulating encapsulation 140*m* is a molding compound formed by a molding process. The insulating encapsulation 140*m* may include a modified material having a chemical structure having —Si—O—Si— bond therein and a —Si—OH group at terminals thereof, where the modified material may be obtained by modifying a non-modified material by an additive. In some embodiments, the non-modified material includes polymers (such as epoxy resins, phenolic resins, silicon-containing resins, or other suitable resins), dielectric materials or other suitable materials, where the additive includes a surfactant such as a zwitterionic surfactant having silicon atoms, titanium or the like. In some embodiments, based on a total amount of the modified material used for the insulating encapsulation 140*m*, an amount of the non-modified material is approximately 90 wt % to 99.9 wt % and an amount of the additive is approximately 0.1 wt % to 10 wt %. Alternatively, the insulating encapsulation 140*m* may include an acceptable insulating encapsulation material that facilitates the formation of a surface-modifying film 150 later formed in conjunction with FIG. 4 and FIG. 5. In some embodiments, the insulating encapsulation 140*m* further includes inorganic filler or inorganic compound (e.g. silica, clay, and so on) which can be added therein to optimize coefficient of CTE of the insulating encapsulation 140*m*. The disclosure is not limited thereto.

In certain embodiments, as shown in FIG. 2, a material of the insulating encapsulation 140*m* may be different from a material of the encapsulant 125 of the semiconductor die 120, where a clear interface is presented between the insulating encapsulation 140*m* and the encapsulant 125. However, the disclosure is not limited thereto; the material of the insulating encapsulation 140*m* may be the same as the material of the encapsulant 125 of the semiconductor die 120, where there is no clear interface between the insulating encapsulation 140*m* and the encapsulant 125.

Figure 3:
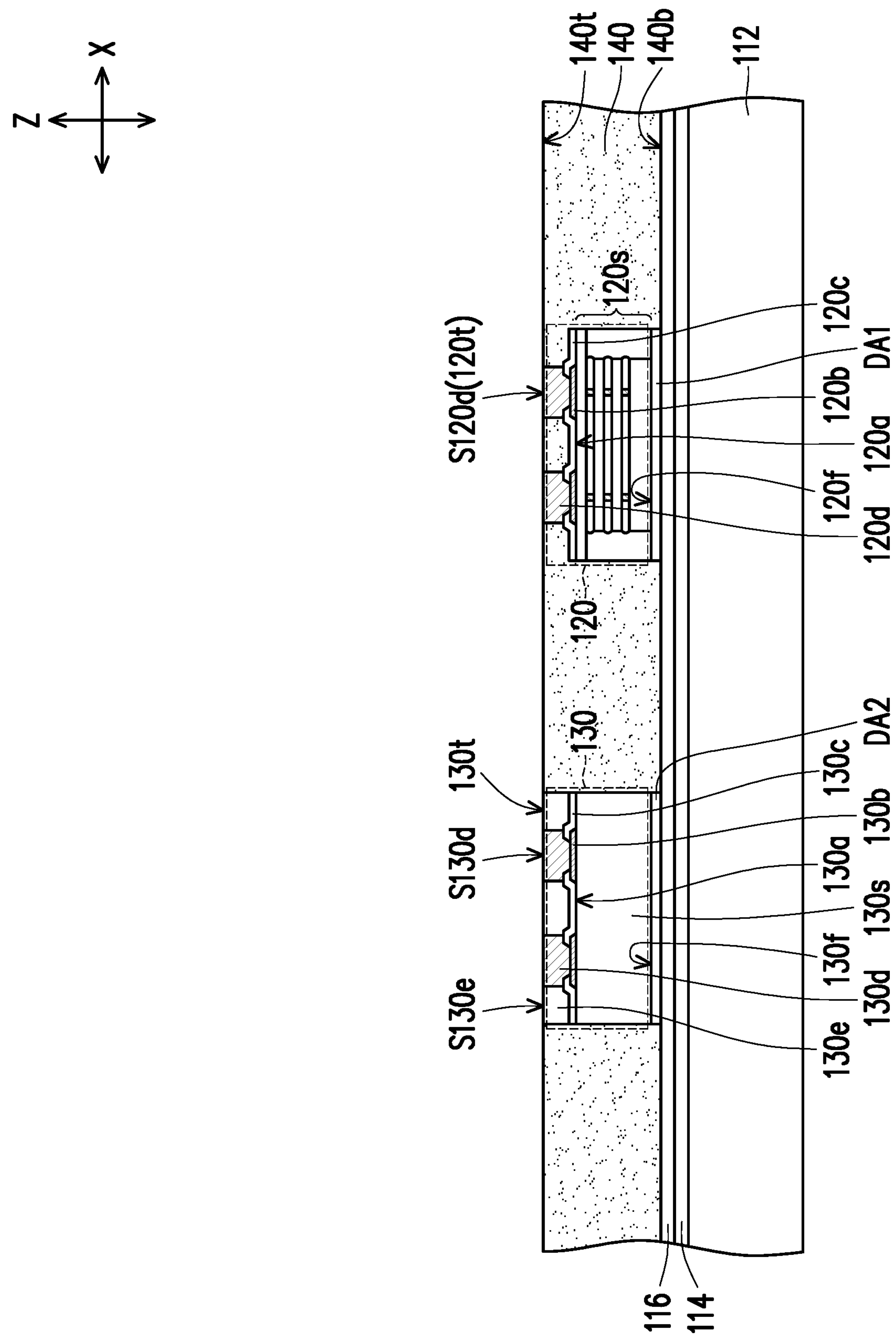

Referring to FIG. 3, in some embodiments, the insulating encapsulation 140*m* is planarized to form an insulating encapsulation 140 exposing the semiconductor dies 120 and 130. In certain embodiments, as shown in FIG. 3, after the planarization, a top surface 120*t* (e.g., top surfaces S120*d* of the conductive vias 120*d*) of the semiconductor die 120 and a top surface 130*t* (e.g., top surfaces S130*d* of the conductive vias 130*d* and a top surface S130*e* of the protection layer 130*e*) of the semiconductor die 130 are exposed by a top surface 140*t* of the insulating encapsulation 140. That is, for example, the top surface 120*t* of the semiconductor die 120 and the top surface 130*t* of the semiconductor die 130 become substantially leveled with the top surface 140*t* of the insulating encapsulation 140. In other words, the top surface 120*t* of the semiconductor die 120, the top surface 130*t* of the semiconductor die 130 and the top surface 140*t* of the insulating encapsulation 140 are substantially coplanar to each other.

The semiconductor dies 120 and 130 are laterally exposed by the insulating encapsulation 140, for example. In some embodiments, as shown in FIG. 3, the semiconductor dies 120 and 130 are accessibly revealed by the insulating encapsulation 140. That is, for example, the conductive vias 130*d* and the protection layer 130*e* of the semiconductor die 130 and the conductive vias 120*d* of the semiconductor die 120 are accessibly revealed by the insulating encapsulation 140, and sidewalls of the semiconductor dies 120 band 130 and sidewalls of the bonding films DA1, DA2 are in contact with (and covered by) the insulating encapsulation 140. The insulating encapsulation 140*m* may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140*m*, the conductive vias 130*d* and the protection layer 130*e* of the semiconductor die 130 and/or the conductive vias 120*d* of the semiconductor die 120 may also be planarized. In certain embodiments, the planarizing step may be, for example, performed on the over-molded insulating encapsulation 140*m* to level the top surface 140*t* of the insulating encapsulation 140, the top surface 120*t* of the semiconductor die 120 and the top surface 130*t* of the semiconductor die 130.

Figure 4:
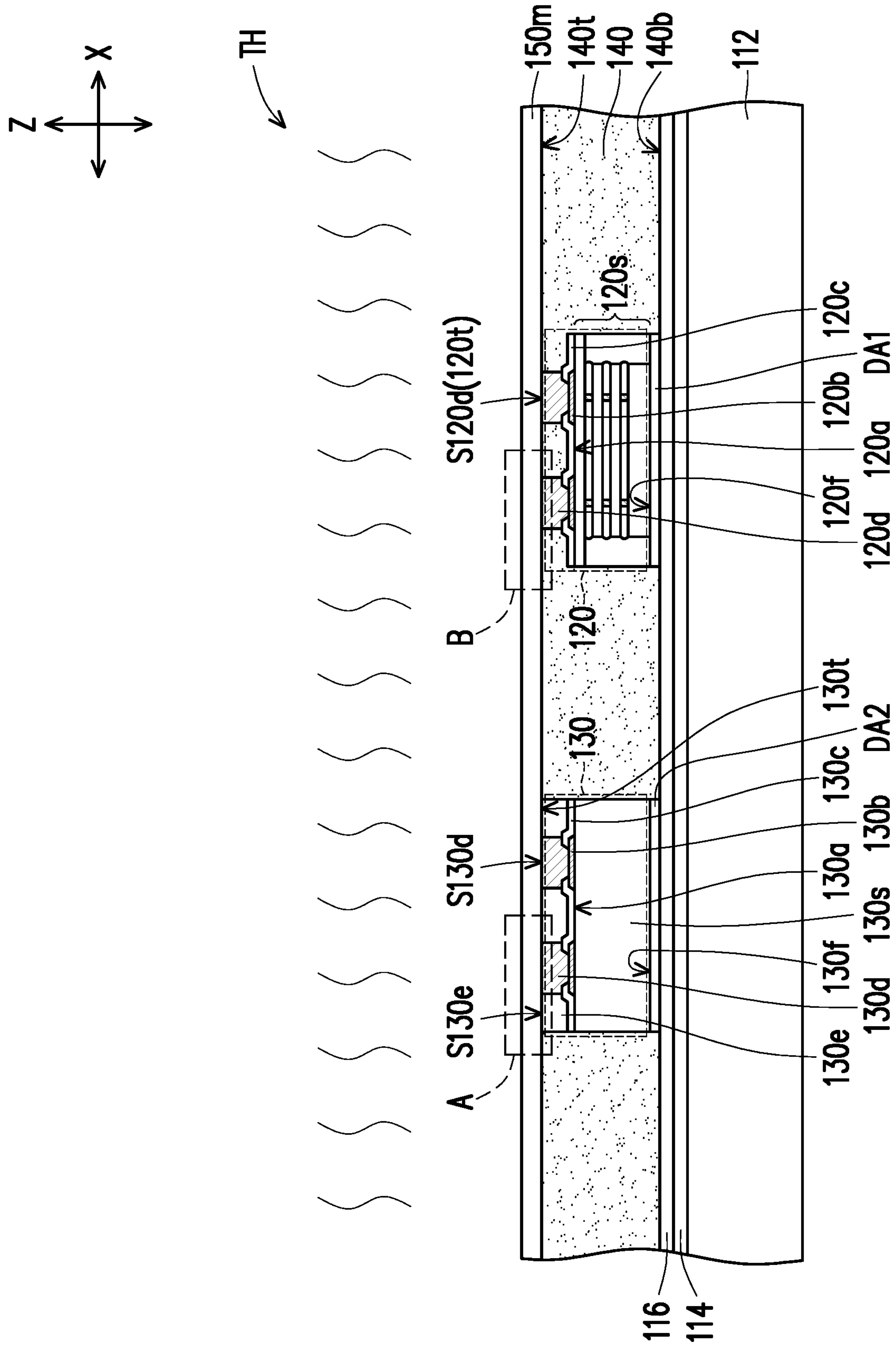

Referring to FIG. 4, in some embodiments, a surface-modifying material 150*m* is formed on the semiconductor dies 120, 130 and the insulating encapsulation 140. For example, the surface-modifying material 150*m* is coated on the top surface 120*t* of the semiconductor die 120, the top surface 130*t* of the semiconductor die 130 and the top surface 140*t* of the insulating encapsulation 140. In other words, the semiconductor dies 120, 130 and the insulating encapsulation 140 are embedded in (e.g., completely covered by) the surface-modifying material 150*m*, for example. As shown in FIG. 4, the surface-modifying material 150*m* is disposed on the semiconductor dies 120, 130 and the insulating encapsulation 140 in the way of a blanket layer made of a surface-modifying solution composition covering the semiconductor dies 120, 130 and the insulating encapsulation 140, in some embodiments. The surface-modifying material 150*m* may be formed by suitable fabrication techniques such as spraying, spin-on coating, dipping or the like.

In some embodiments, the surface-modifying solution composition includes a solvent and a first compound having a chemical structure with a —(OH) or —(COO)— group (will be described later in greater detail below). In some embodiments, the first compound is mixed into the solvent using any of the mixing manners commonly used in the art (for example, using a mixer or a dispersing device) to form a liquid dispersion (e.g., serving as the surface-modifying solution composition). There is no specific limitation to the solvent of the disclosure as long as the solvent can serve as a vehicle carrier of the first compound without interact therewith, and the solvent with the first compound can capable of maintaining a film-form (for forming the surface-modifying material 150*m* over the semiconductor dies 120, 130 and the insulating encapsulation 140).

In some embodiments, the solvent is volatile. Examples of the solvent include, but are not limited to, (1) alkylene glycol monoalkyl ether compounds: ethylene glycol monomethyl ether, ethylene glycol monoethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, and the like; (2) alkylene glycol monoalkyl ether acetate compounds: ethylene glycol monomethyl ether acetate, ethylene glycol monoethyl ether acetate, propylene glycol monomethyl ether acetate, propylene glycol monoethyl ether acetate, and the like; (3) other ether compounds: diethylene glycol dimethyl ether, diethylene glycol methyl ethyl ether, diethylene glycol diethyl ether, tetrahydrofuran, and the like; (4) ketone compounds: methyl ethyl ketone, cyclopentanone, cyclohexanone, 2-heptanone, 3-heptanone, diacetone alcohol, and the like; (5) alkyl lactate compounds: methyl 2-hydroxypropionate, ethyl 2-hydroxypropionate, and the like; (6) other ester compounds: methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutyrate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl acetate, i-pentyl acetate, n-butyl propionate, ethyl butyrate, n-propyl butyrate, i-propyl butyrate, n-butyl butyrate, methyl pyrutate, ethyl pyrutate, n-propyl pyrutate, methyl acetoacetate, ethyl acetoacetate, ethyl 2-oxybutyrate, and the like; (7) aromatic hydrocarbon compounds: toluene, xylene, and the like; (8) carboxylic amine compounds: N-methylpyrrolidone, N,N-dimethylformamide, N,N-dimethylacetamide, and the like; and (9) any combinations of the aforesaid compounds (1)-(8). In alternative embodiments, the solvent is environmentally friendly, such as gamma-butyrolactone (GBL) or the like. The aforesaid examples of the solvent can be used alone or in combinations thereof.

In some embodiments, the first compound having a chemical structure with a —(OH) or —(COO)— group is a compound has a functional group —(OH) or —(COO)— and is selected from the group consisting of a compound having a structure unit represented by chemical formula (1), a compound having a structure unit represented by chemical formula (2), a compound having a structure unit represented by chemical formula (3), a compound having a structure unit represented by chemical formula (4), a compound having a structure unit represented by chemical formula (5), and a compound having a structure unit represented by chemical formula (6), chemical formula (1)

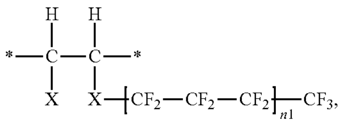

chemical formula (2)

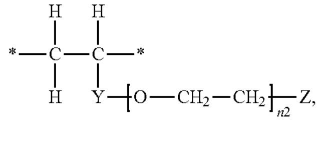

chemical formula (3)

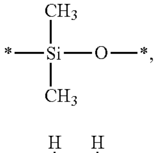

chemical formula (4)

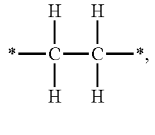

-continued chemical formula (5)

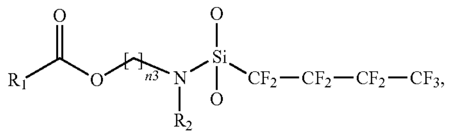

and chemical formula (6)

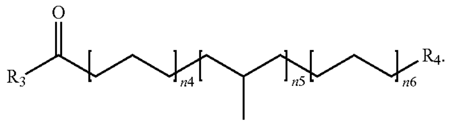

In the chemical formula (1), X represents —($CH_2$)—, —($SO_2$)—, —(NH)—, —($NR_5$)—, a hydrogen atom, a substituted or unsubstituted alkyl chain having a linear-like structure, a branch-like structure, a comb-like structure or a star-like structure, a substituted or unsubstituted alkylene group, or an aromatic ring. In some embodiments, n1 is an integer of 1-10000. In some embodiments, $R_5$ represents —$CH_3$, —$CH_2CH_3$ or —$CH_2CH_2NH_2$.

In the chemical formula (2), Y represents —($CH_2$)—, —($SO_2$)—, —(NH)—, —($NR_6$)—, a hydrogen atom, a substituted or unsubstituted alkyl chain having a linear-like structure, a branch-like structure, a comb-like structure or a star-like structure, a substituted or unsubstituted alkylene group, or an aromatic ring, and Z represents a hydrogen atom, —($COOR_7$), —($R_8$—$CH_3$), or —($(CH_2)_{n7}$)—$CH_3$. In some embodiments, n2 is an integer of 1-10000. In some embodiments, $R_6$ represents —$CH_3$, —$CH_2CH_3$ or —$CH_2CH_2NH_2$. In some embodiments, $R_7$ represents —$CH_3$, —$CH_2CH_3$ or —$CH_2CH_2NH_2$. In some embodiments, $R_8$ represents —($CH_2$)— or —($OCH_2$)—. In some embodiments, n7 is an integer of 1-10000.

In the chemical formula (5), $R_1$ represents —$CH_3$, —$CH_2CH_3$ or —$CH_2CH_2NH_2$, and $R_2$ represents a hydrogen atom, —$CH_3$ or —$CH_2CH_3$. In some embodiments, n3 is an integer of 1-10000.

In the chemical formula (6), $R_3$ represents —$CH_3$, —$CH_2CH_3$ or —$CH_2CH_2NH_2$, and $R_4$ represents —$CH_3$, —$OCH_3$, —$CH_2CH_3$, —$OCH_2CH_3$ or —$CH_2CH_2NH_2$. In some embodiments, n4 is an integer of 1-10000. In some embodiments, n5 is an integer of 1-10000. In some embodiments, n6 is an integer of 1-10000.

In some embodiments, the first compound has a number average molecular weight (Mn) of about 70 g/mol to 10000 g/mol. In some embodiments, the —(OH) or —(COO)— group may be bonded to one of the structure units represented by the above chemical formula (1) through chemical formula (6) at a site indicated by a symbol "*".

In certain embodiments, the surface-modifying solution composition further includes a second compound. For example, the second compound includes a modified polymer having a chemical structure having —Si—O—Si— bond therein and a —Si—OH group at terminals thereof, where the modified polymer may be obtained by modifying a non-modified polymer by an additive. In some embodiments, the non-modified polymer includes polymers such as epoxy, PI, PBO, bismaleimide (BMI), bismaleimide-triazine (BT), poly(phenylene oxide) (PPO) or any combinations thereof, where the additive includes a surfactant such as a zwitterionic surfactant having silicon atoms, titanium, or the like. In some embodiments, based on a total amount of the second compound, an amount of the non-modified polymer is approximately 90 wt % to 99.9 wt % and an amount of the additive is approximately 0.1 wt % to 10 wt %. Due to the second compound, the formation of the film-form made of the surface-modifying solution composition is facilitated. Similarly to the above, the first compound and the second compound may be mixed into in the solvent using any of the mixing manners commonly used in the art to form a liquid dispersion serving as the surface-modifying solution composition, where the solvent can serve as a vehicle carrier of the first and second compounds without interact therewith, and the solvent with the first and second compounds can be capable of maintaining a film-form. In some embodiments, based on a total amount of the surface-modifying solution composition, an amount of the solvent is approximately 90 wt % to 98.8 wt %, an amount of the first compound is approximately 0.10 wt % to 5.0 wt %, and an amount of the second compound is approximately 0.10 wt % to 5.0 wt %. In some embodiments, before forming the surface-modifying material 150*m* on the structure depicted in FIG. 3, the first compound and the second compound are well-mixed and distributed in the solvent.

Figure 5:
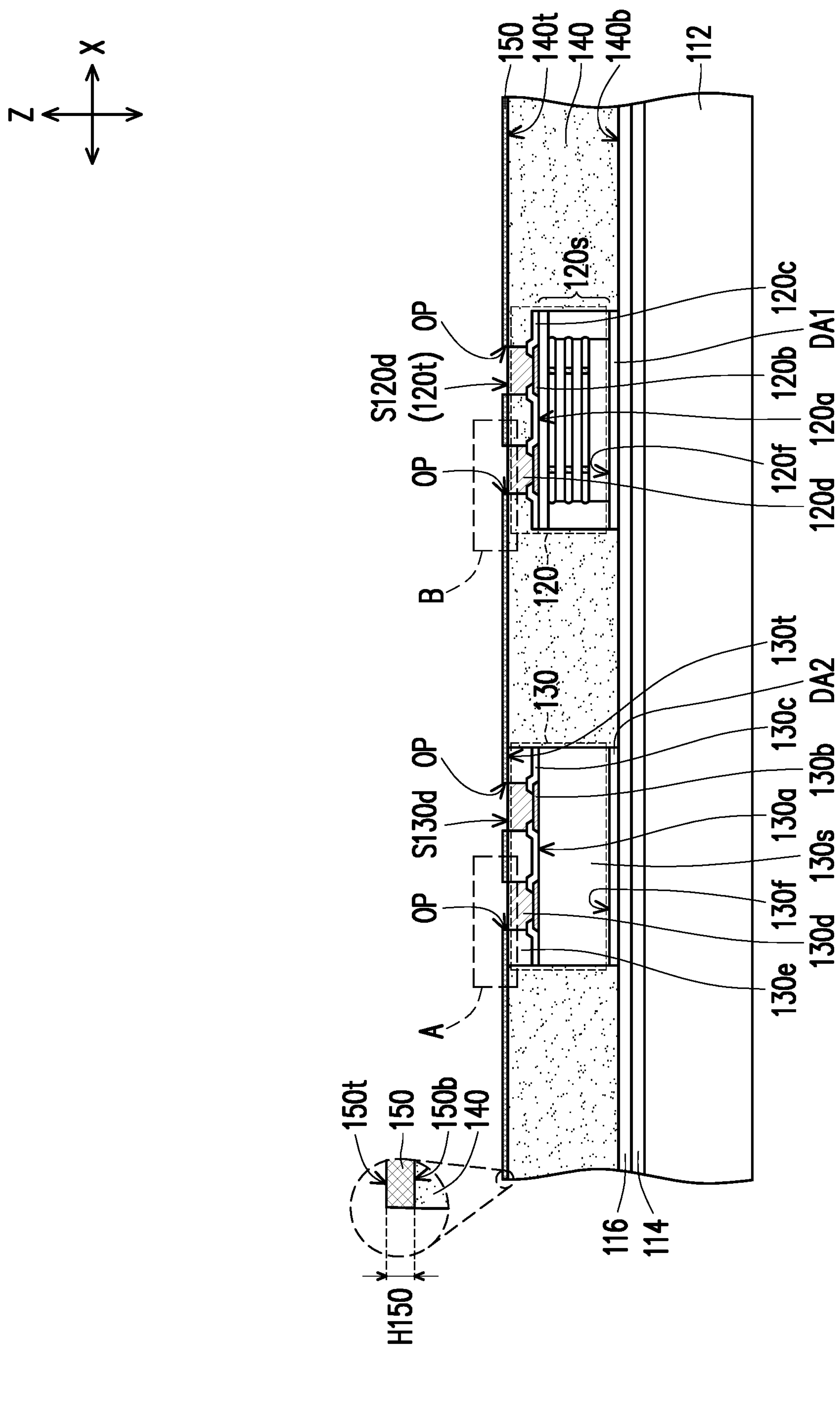

Referring to FIG. 4 and FIG. 5 together, in some embodiments, a thermal treatment TH is performed on the surface-modifying material 150*m* to form the surface-modifying film 150 on the semiconductor dies 120, 130 and the insulating encapsulation 140. For example, the thermal treatment TH is performed on the surface-modifying material 150*m* to form a fully cured film, e.g. the surface-modifying film 150, in contact with the protection layer 130*e* of the semiconductor die 130 and the insulating encapsulation 140. In some embodiments, a thickness $H_{150}$ (from a bottom surface 150*b* to a top surface 150*t*) of the surface-modifying film 150 is approximately ranging from 1 nm to 20 nm along the direction Z. The descriptions with respect to the chemical mechanism of forming surface-modifying film 150 will be discussed in greater detail below in conjunction with FIGS. 22A-22B (depicting an enlarged, schematic view of a dotted box labeled as “A” in FIGS. 4-5) and FIGS. 23A-23B (depicting an enlarged, schematic view of a dotted box labeled as “B” in FIGS. 4-5). In FIG. 22A, FIG. 23A and FIG. 4, for example, the insulating encapsulation 140 includes a modified material and a filler distributed in the modified material, and the modified material has a three-dimensional network structure with a —Si—O—Si— bond, where a top layer of the three-dimensional network structure, which is nearest to the top surface 140*t* of the insulating encapsulation 140, has —(OH) groups (or saying —(Si—OH) groups, see the dotted box A of FIG. 22A and the dotted box B of FIG. 23A). On the other hand, in FIG. 22A and FIG. 4, for example, the protection layer 130*e* includes a modified material having a three-dimensional network structure with a —Si—O—Si— bond, where a top layer of the three-dimensional network structure, which is nearest to the top surface S130*e* of the protection layer 130*e*, has —(OH) groups (or saying —(Si—OH) groups, see the dotted box A of FIG. 22A).

For illustrative purposes, a non-limiting example is provided, but the disclosure is not limited thereto. For such non-limiting example, the material of the insulating encapsulation 140 includes a modified polymer (such as the modified epoxy, PI, BT or PBO as mentioned above) and the filler (such as irregular-shape or spherical-shape fused silica) dispensing therein (where the filler is not shown in FIGS. 22A-22B and FIGS. 23A-23B for simplicity), and the material of the protection layer 130*e* includes a modified polymer (such as the modified epoxy, PI, BT or PBO as mentioned above). In such non-limiting example, the first compound and the second compound are well-mixed and distributed in the solvent, where the first compound (labeled as 154 in FIG. 22A and FIG. 23A, where only the —(OH) group and a carbon atom boned thereto are shown, and the rest of structure are omitted and schematically represented by an ellipse for simplicity) in the surface-modifying material 150*m* includes the compound represented by one of chemical formula (1) through chemical formula (6), the second compound (not shown in FIGS. 22A-22B and FIGS. 23A-23B) in the surface-modifying material 150*m* includes a modified polymer (such as the modified epoxy, PI, BT or PBO as mentioned above), and the solvent (labeled as 152 in FIG. 22A and FIG. 23A) in the surface-modifying material 150*m* includes one of propylene glycol methyl ether acetate (as known as propylene glycol monomethyl ether acetate), gamma-butyrolactone or cyclopentanone.

In some embodiments, the thermal treatment TH is performed at a workable temperature of about 70° C. to about 200° C. for 2 to 10 minutes for subjecting the first compound of the surface-modifying material 150*m* and the insulating encapsulation 140 and the protection layer 130*e* by dehydration (e.g., the removal of $H_2O$, which involves —(OH) groups from the first compound 154 and —(OH) groups from the insulating encapsulation 140 and the protection layer 130*e*) to form the surface-modifying film 150 on the top surface S130*e* of the protection layer 130*e* and the top surface 140*t* of the insulating encapsulation 140, where a —Si—O—C— bond is generated at a (bonding) interface between the surface-modifying film 150 and the insulating encapsulation 140 and a (bonding) interface between the surface-modifying film 150 and the protection layer 130*e* (see the dotted box A of FIG. 22B and the dotted box B of FIG. 23B). Besides, during the thermal treatment TH, the first compound and the second compound also undergoes the reaction of dehydration, which facilitates the formation of the surface-modifying film 150*l*. On the other hand, in the disclosure, during the thermal treatment TH, the first compound and the second compound of the surface-modifying material 150*m* is not reacted to a metal or metal alloy, such as the conductive vias 120*d* of the semiconductor die 120 and the conductive vias 130*d* of the semiconductor die 130. As illustrated in FIG. 5, for example, the surface-modifying film 150 is formed with a plurality of contact openings OP exposing the conductive vias 120*d* of the semiconductor die 120 and the conductive vias 130*d* of the semiconductor die 130. In some embodiments, along the direction X, a sidewall SW0 of each contact opening OP formed in the surface-modifying film 150 is offset from a sidewall (not labeled) of a respective one conductive via 120*d* or 130*d* exposing therefrom, see FIG. 22B and FIG. 23B. That is to say, the surface-modifying film 150 is not in physical contact with the conductive vias 120*d* of the semiconductor die 120 and the conductive vias 130*d* of the semiconductor die 130. For example, the surface-modifying film 150 is free from the top surface S120*d* of the conductive vias 120*d* and the top surface S130*d* of the conductive vias 130*d*. Due to the —Si—O—C— bond at the interfaces between the surface-modifying film 150 and the insulating encapsulation 140 and between the surface-modifying film 150 and the protection layer 130*e*, the bonding strengths between the surface-modifying film 150 and the insulating encapsulation 140 and between the surface-modifying film 150 and the protection layer 130*e* are greatly ensured.

In some embodiments, after the thermal treatment TH, a cleaning process is performed to remove the rest of the surface-modifying material 150*m* un-reacted with (e.g. un-bonding to) the protection layer 130*e* and the insulating encapsulation 140. For example, the cleaning process is performed at a workable temperature of about 20° C. to about 30° C. for 3 to 5 seconds with a chemical solution of propylene glycol methyl ether acetate, gamma-butyrolactone or cyclopentanone. For example, during the cleaning process, the rest of the surface-modifying material 150*m* un-reacted with (e.g. un-bonding to) the protection layer 130*e* and the insulating encapsulation 140 is washed away from the top surface 150*t* of the surface-modifying film 150, the top surface S120*d* of the conductive vias 120*d* and the top surface S130*d* of the conductive vias 130*d*. As shown in FIG. 5, for example, the surface-modifying film 150 is in physical contact with the top surface S130*e* of the protection layer 130*e* and the top surface 140*t* of the insulating encapsulation 140, but not in contact with the conductive vias 120*d* of the semiconductor die 120 and the conductive vias 130*d* of the semiconductor die 130. For example, the contact openings OP formed in the surface-modifying film 150 exposes the sidewalls of the conductive vias 120*d* and 130*d*, as shown in FIG. 22B and FIG. 23B. The sidewalls of the conductive vias 120*d* and 130*d* may be referred to as edges of the conductive vias 120*d* and 130*d*.

In some embodiments, a material of the surface-modifying film 150 is different from the material of the insulating encapsulation 140 and the material of the protection layer 130*e*. That is, for example, the material of the surface-modifying film 150, a dielectric material used for forming a dielectric layer of a redistribution circuit structure (will be described in greater detail below in conjunction with FIG. 6 through FIG. 12) and the material of the insulating encapsulation 140 possess the different surface energies, where the contact angles of the surface-modifying film 150, the dielectric layer and the insulating encapsulation 140 are 15°, 33° and 18°, respectively. Owing to the surface-modifying film 150, the difference of the surface energies in the heterojunction interface aforementioned can be effectively improved. In other words, due to the presence of the surface-modifying film 150, the formation of the redistribution circuit structure depicted in FIG. 6 through FIG. 12 is facilitated. In detail, if considering the amount of the first compound is less than 0.10 wt % in the surface-modifying solution composition, the formation of the surface-modifying film 150 is not achieved. On the other hand, if considering the amount of the first compound is more than 5 wt % in the surface-modifying solution composition, although the formation of the surface-modifying film 150 is achieved, the element presented inside the surface-modifying film 150 is diffusing into the later-formed redistribution circuit structure, which greatly impacts (e.g., deteriorates) the reliability of a package structure in its electrical performance.

In some alternative embodiments, before applying the surface-modifying material 150*m* on the structure depicted in FIG. 3, a pre-cleaning step may be performed to remove any undesired substance or particles remained on the insulating encapsulation 140 and the semiconductor dies 120, 130. For example, the pre-cleaning step include a process using a chemical cleaner such as CX-100 (e.g. citric acid) or other suitable chemicals (e.g., HCl or $H_2SO_4$). In some embodiments, after the pre-cleaning step, a rinsing step (with DI water) may be performed to remove the chemicals used in the pre-cleaning process. In addition, after each of the rinsing step and the cleaning process, a drying step may be further optionally performed, for example, by using nitrogen gas at a workable temperature of about 30° C. to about 80° C. for 1 minute.

Referring to FIG. 6 through FIG. 12, in some embodiments, a redistribution circuit structure 160 is formed on the surface-modifying film 150. For example, as shown in FIG. 6 to FIG. 12, the redistribution circuit structure 160 includes a dielectric layer 162 (e.g. a dielectric layer 162-1, a dielectric layer 162-2, and a dielectric layer 162-3), a seed layer 164 (e.g. a seed layer 164-1, a seed layer 164-2, and a seed layer 164-3), a patterned conductive layer 166 (e.g. a patterned conductive layer 166-1, a patterned conductive layer 166-2, and a patterned conductive layer 166-3), and a dielectric layer 168. However, in the disclosure, the numbers of layers of the dielectric layer 162, the seed layer 164 and the patterned conductive layer 166 are not limited to what is depicted in FIG. 6 to FIG. 12, where the numbers of the layers of the dielectric layer 162, the seed layer 164 and the patterned conductive layer 166 may be one or more than one. In some embodiments, the dielectric layer 162, the seed layer 164 and the patterned conductive layer 166 are sandwiched between the surface-modifying film 150 and the dielectric layer 168 and are sequentially stacked.

Figure 6:
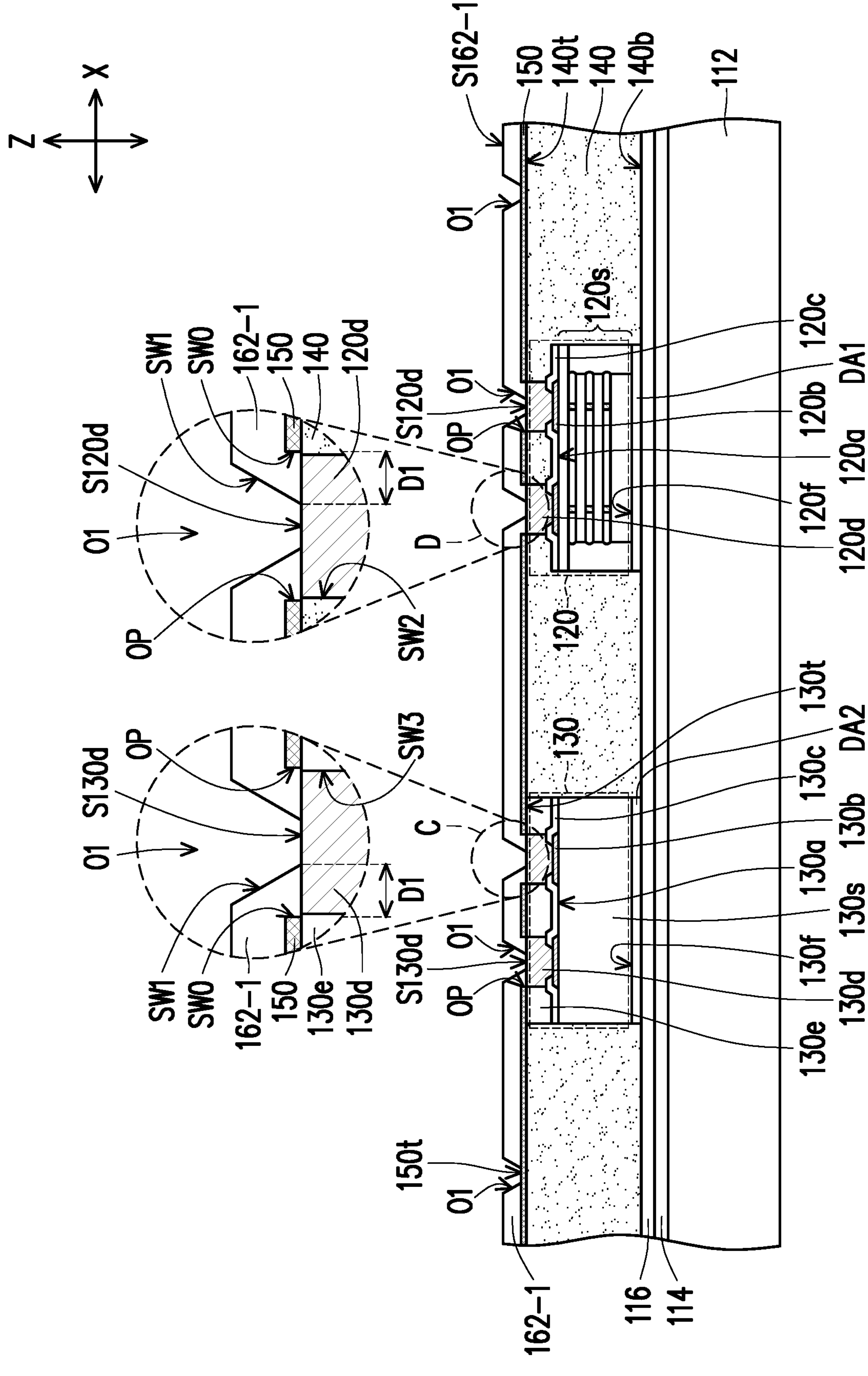

Referring to FIG. 6, in some embodiments, a dielectric layer 162-1 is formed on the surface-modifying film 150. For example, the dielectric layer 162-1 is formed by, but not limited to, forming a blanket layer of a dielectric material over the structure depicted in FIG. 5 to extend over and cover the surface-modifying film 150 and the conductive vias 120*d*, 130*d* exposed by the contact openings OP formed in the surface-modifying film 150, and then patterning the dielectric material blanket layer to form the dielectric layer 162-1 with a plurality of opening holes O1. In some embodiments, some of the opening holes O1 are corresponding to (e.g. overlapped with in the direction Z) the contact openings OP formed in the surface-modifying film 150, and the rest of the opening holes O1 are not corresponding to (e.g. overlapped with in the direction Z) the contact openings OP. For example, as shown in FIG. 6, the conductive vias 120*d* of the semiconductor die 120 and the conductive vias 130*d* of the semiconductor die 130 are accessibly revealed by the surface-modifying film 150 (via the contact openings OP) and the dielectric layer 162-1 (via some of the opening holes O1 corresponding to the contact openings OP).

In some embodiments, as shown in FIG. 6, an illustrated bottom opening of each of the contact openings OP and an illustrated bottom opening of each of the opening holes O1, in correspondence with portions of the dielectric layer 162-1 extending into the contact openings OP formed in the surface-modifying film 150, are located at the same surface, such as the top surface S120*d* of the conductive vias 120*d* or the top surface S130*d* of the conductive vias 130*d*. In other words, the illustrated bottom openings of the opening holes O1 and the illustrated bottom openings of the contact openings OP in correspondence with portions of the dielectric layer 162-1 extending into the contact openings OP are opened at a plane where the bottom surface 150*b* of the surface-modifying film 150 located at. On the other hand, the rest of the opening holes O1 (which are not in correspondence with portions of the dielectric layer 162-1 extending into the contact openings OP formed in the surface-modifying film 150) each have an illustrated bottom opening located at the top surface 150*t* of the surface-modifying film 150, as shown in FIG. 6, in some embodiments. In addition, as shown in FIG. 6, all of the contact openings OP each have an illustrated top opening located at the top surface S162-1 of the dielectric layer 162-1, for example.

In some embodiments, as shown in FIG. 6, along the direction Z, a depth of the opening holes O1 is greater than a depth of the contact openings OP; and along the direction X, a minimum width of the opening holes O1 is less than a minimum width of the contact openings OP. In some embodiments, a sidewall SW1 of each of the opening holes O1 is not aligned with a sidewall SW0 of a respective one of the contact openings OP. In one embodiment, the sidewall SW1 of each of the opening holes O1 is slant in reference with the direction Z. However, the disclosure is not limited thereto; alternatively, the sidewall SW1 of each of the opening holes O1 may be vertical in reference with the direction Z. In some embodiments, a maximum distance D1 between the sidewall SW0 and the sidewall SW1 is approximately ranging from 14 μm to 28 μm. For example, as shown in a dotted circle labeled by "C" depicted in FIG. 6, the sidewall SW0 of the contact opening OP is not aligned with a sidewall SW3 of the conductive vias 130*d* exposed therefrom, and is not aligned with the sidewall SW1 of the respective one opening hole O1. On the other hand, for example, as shown in a dotted circle labeled by "D" depicted in FIG. 6, the sidewall SW0 of the contact opening OP is not aligned with a sidewall SW2 of the conductive vias 120*d* exposed therefrom, and is not aligned with the sidewall SW1 of the respective one opening hole O1.

The disclosure is not limited thereto. In alternative embodiments, as shown in FIGS. 16A and 16B, along the direction Z, the depth of the opening holes O1 is greater than the depth of the contact openings OP; and along the direction X, the minimum width of the opening holes O1 is substantially equal to the minimum width of the contact openings OP. In one embodiment, the sidewall SW1 of each of the opening holes O1 is vertical in reference with the direction Z, where the sidewall SW1 of each of the opening holes O1 is aligned with a sidewall SW0 of a respective one of the contact openings OP. In another embodiment, the sidewall SW1 of each of the opening holes O1 is slant in reference with the direction Z, where the sidewall SW1 of each of the opening holes O1 is not aligned with a sidewall SW0 of a respective one of the contact openings OP. For example, as shown in a dotted circle labeled by "C" depicted in FIG. 16A, the sidewall SW0 of the contact opening OP is not aligned with a sidewall SW3 of the conductive vias 130*d* exposed therefrom, and is substantially aligned with the sidewall SW1 (e.g. the vertical sidewall) of the respective one opening hole O1. On the other hand, for example, as shown in a dotted circle labeled by "D" depicted in FIG. 16B, the sidewall SW0 of the contact opening OP is not aligned with a sidewall SW2 of the conductive vias 120*d* exposed therefrom, and is substantially aligned with the sidewall SW1 (e.g. the vertical sidewall) of the respective one opening hole O1. As shown in FIG. 16A and FIG. 16B, the dielectric layer 162-1 completely stands on the surface-modifying film 150 and is free from the conductive vias 120*d* and 130*d*, for example.

In further alternative embodiments (not shown), the dielectric layer 162-1 still completely stands on the surface-modifying film 150 and being free from the conductive vias 120*d* and 130*d*, where the minimum width of the opening holes O1 is greater than the minimum width of the contact openings OP along the direction X. In such further alternative embodiments, the sidewall SW1 may be a slant sidewall or a vertical sidewall, and the sidewall SW0 of the contact opening OP is not aligned with the sidewall SW2 of the conductive vias 120*d* or the sidewall SW3 of the conductive vias 130*d* exposed therefrom exposed therefrom, and is not aligned with the sidewall SW1 of the respective one opening hole O1. The disclosure is not limited thereto.

The material of the dielectric layer 162-1 may be PI, PBO, BCB, a nitride such as silicon nitride, an oxide such as silicon oxide, PSG, BSG, BPSG, a combination thereof or the like, which may be patterned using a photolithography and/or etching process. In some embodiments, the dielectric layer 162-1 may be formed by suitable fabrication techniques such as spin-on coating, chemical vapor deposition (such as CVD (e.g. PECVD)), or the like. The material of the dielectric layer 162-1 is, for example, made of a photosensitive resin. In certain embodiments, no filler is presented in the dielectric layer 162-1.

Figure 7:
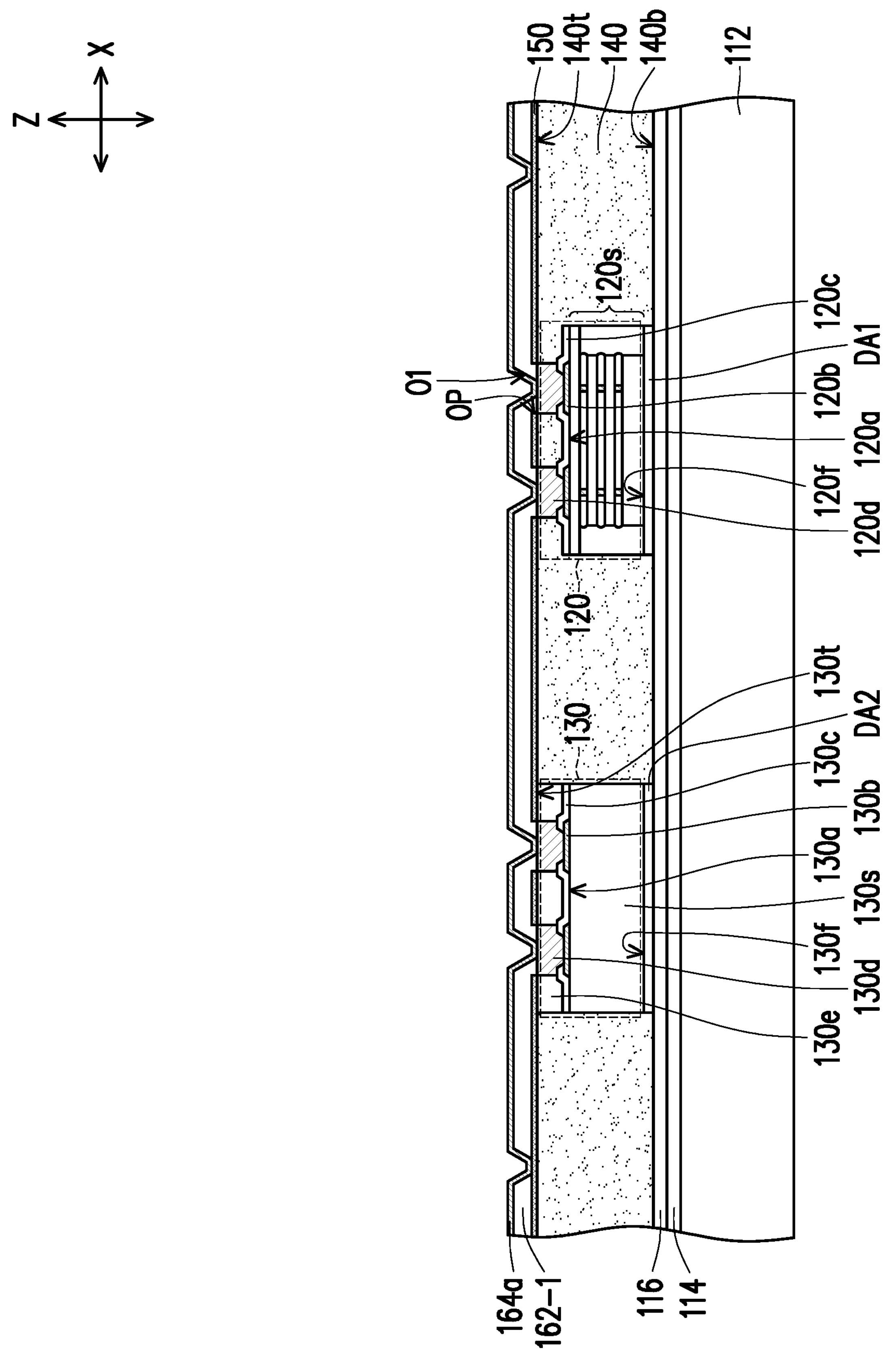

Referring to FIG. 7, in some embodiments, a seed layer 164*a* is formed over the dielectric layer 162-1. In some embodiments, the seed layer 164*a* is conformally formed on the dielectric layer 162-1 and extends into the opening holes O1 formed in the dielectric layer 162-1 to physically contact the conductive vias 120*d* of the semiconductor die 120 and the conductive vias 130*d* of the semiconductor die 130 exposed by the contact openings OP and by the opening holes O1. In other words, the seed layer 164*a* penetrates through the dielectric layer 162-1 and the surface-modifying film 150, where the sidewalls (e.g., SW1 depicted in FIG. 6) of the opening holes O1 are completely covered by the seed layer 164*a*.

In some embodiments, the seed layer 164*a* is formed over the structure depicted in FIG. 6 in a manner of a blanket layer made of metal or metal alloy materials, the disclosure is not limited thereto. In some embodiments, the seed layer 164*a* is referred to as a metal layer, which may be a single layer or a composite layer comprising a plurality of sublayers formed of different materials. In some embodiments, the seed layer 164*a* includes titanium, copper, molybdenum, tungsten, titanium nitride, titanium tungsten, combinations thereof, or the like. For example, the seed layer 164*a* may include a titanium layer and a copper layer over the titanium layer. The seed layer 164*a* may be formed using, for example, sputtering, physical vapor deposition (PVD). or the like. In some embodiments, the seed layer 164*a* may be conformally formed on the dielectric layer 162-1 by sputtering and in contact with the dielectric layer 162-1, the surface-modifying film 150 and the conductive vias 120*d*, 130*d*.

Figure 8:
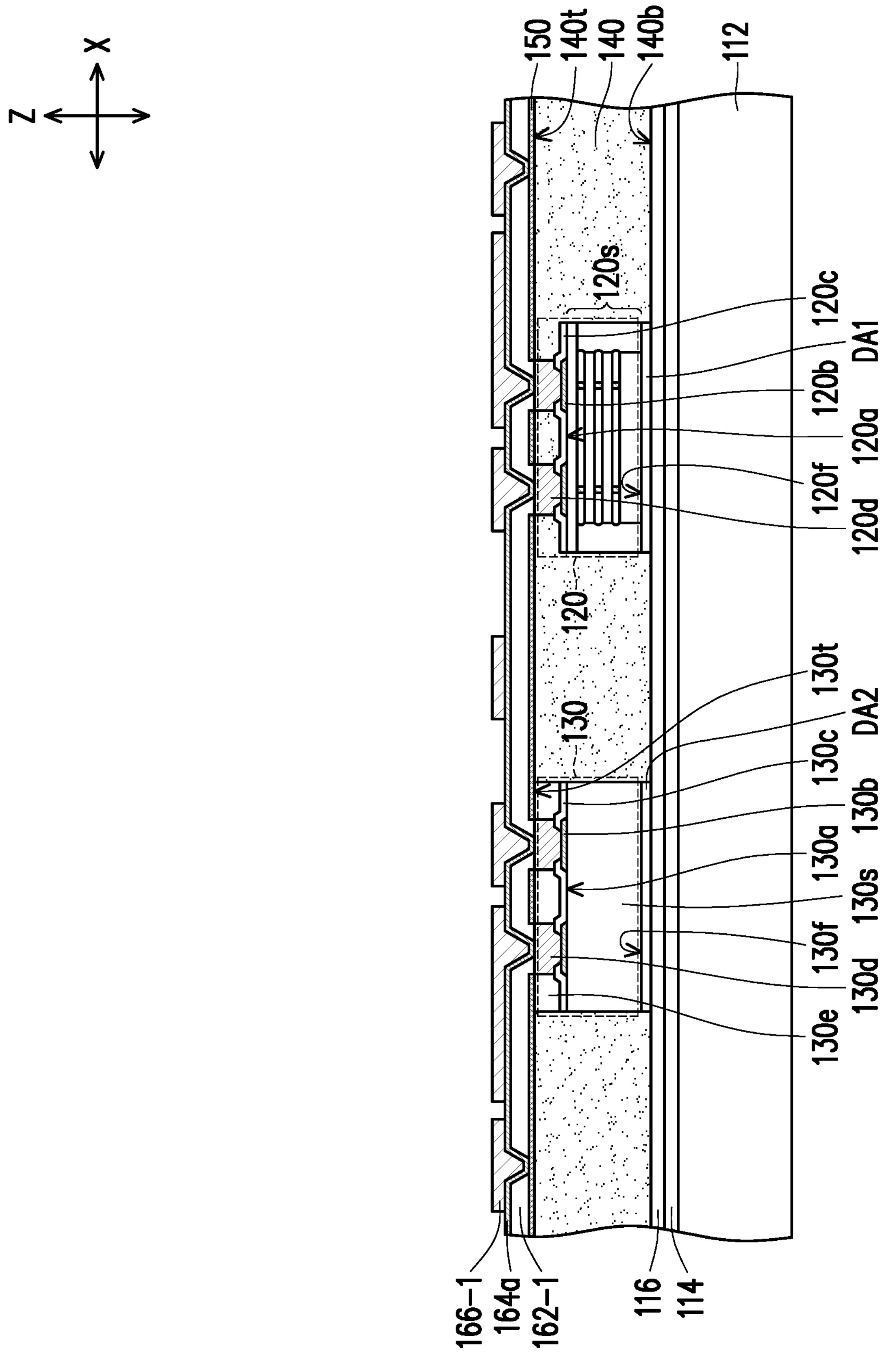

Referring to FIG. 8, in some embodiments, the patterned conductive layer 166-1 is formed on the seed layer 164*a*. In some embodiments, the patterned conductive layer 166-1 may be formed by, but not limited to, forming a blanket layer of conductive material over the structure depicted in FIG. 7 to completely cover the seed layer 164*a* and patterning the conductive material blanket layer to form the patterned conductive layer 166-1.

In one embodiment, the patterned conductive layer 166-1 may be made of conductive materials formed by electroplating or deposition, such as copper, copper alloy, aluminum, aluminum alloy, or combinations thereof, which may be patterned to form a plurality of conductive patterns/segments using a photolithography and etching process. The conductive patterns/segments each may include a line portion extending over the seed layer 164*a* and/or a line portion extending over the seed layer 164*a* in addition to a via portion connecting to the line portion and extending into a respective one opening hole O1. In some embodiments, the patterned conductive layer 166-1 may be a patterned copper layer or other suitable patterned metal layer. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 9:
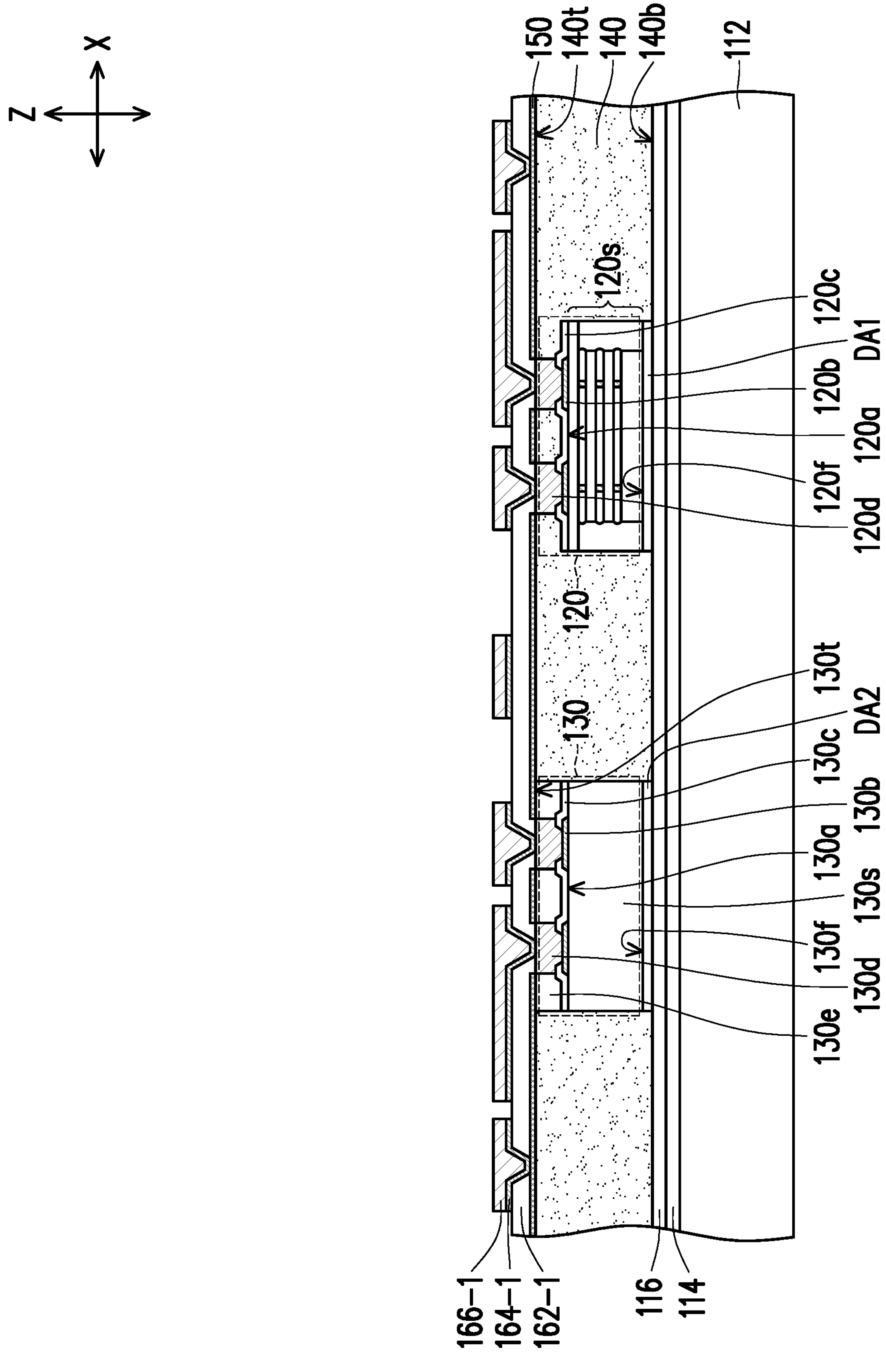

Referring to FIG. 9, in some embodiments, the seed layer 164*a* is patterned to form a seed layer 164-1. In some embodiments, the seed layer 164*a* is patterned by using the patterned conductive layer 166-1 as an etching mask to form the seed layer 164-1. For example, the etching process may be a dry etching process, a wet etching process, or a combination thereof; the disclosure is not limited thereto. In other words, for example, in a vertical projection on the insulating encapsulation 140 (e.g. a vertical projection along the direction Z), the patterned conductive layer 166-1 is completely overlapped with the seed layer 164-1. That is to say, a sidewall of the patterned conductive layer 166-1 is aligned with a sidewall of the seed layer 164-1. In some embodiments, as shown in FIG. 9, the patterned conductive layer 166-1 is electrically connected to the semiconductor dies 120 and/or 130 through connecting the seed layer 164-1 and the conductive vias 120*d* or 130*d*.

Figure 10:
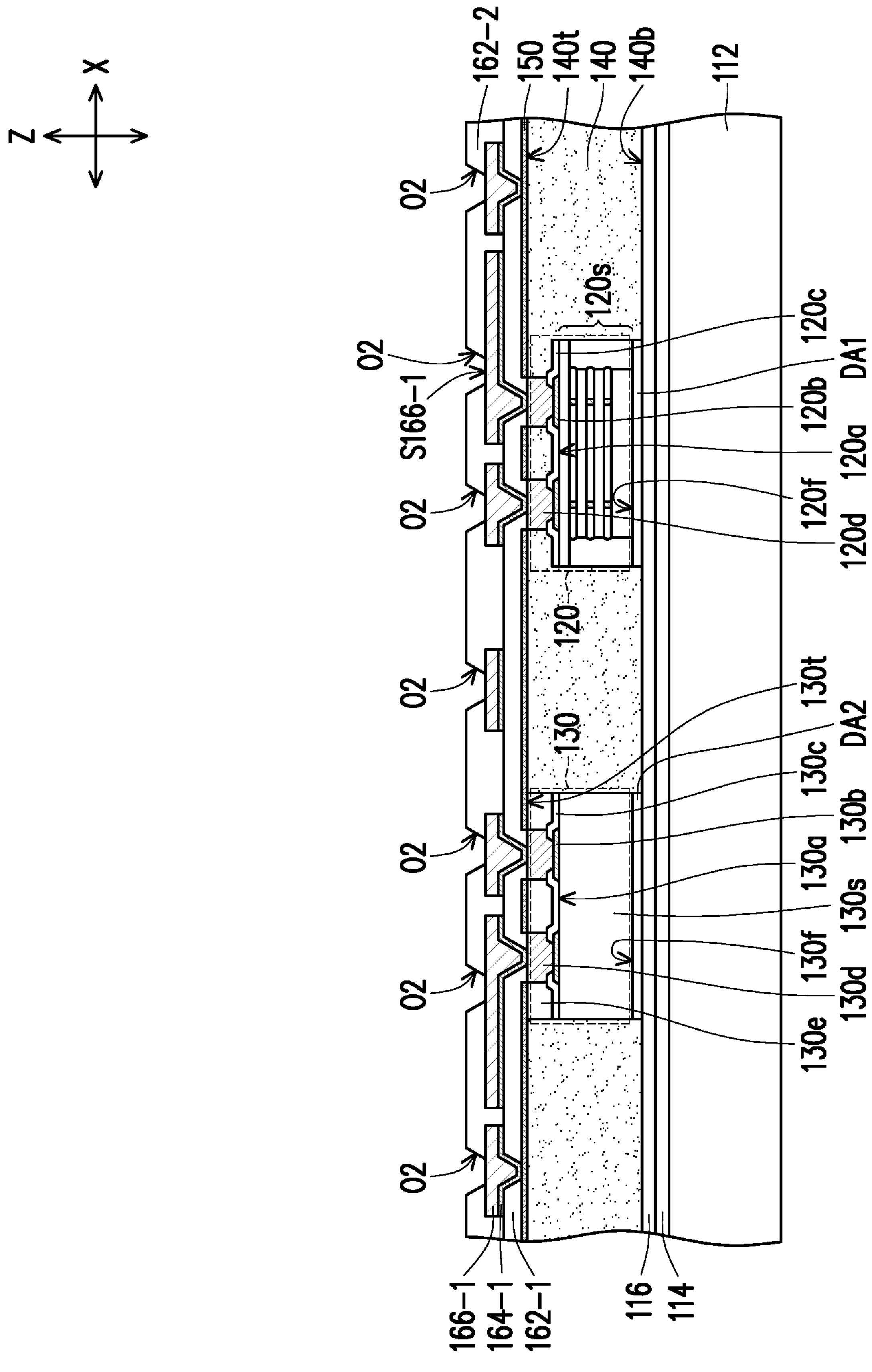

Referring to FIG. 10, in some embodiments, the dielectric layer 162-2 is formed over the patterned conductive layer 166-1. In some embodiments, the dielectric layer 162-2 has a plurality of opening holes O2 each exposing a portion of the patterned conductive layer 166-1. As show in FIG. 10, through the opening holes O2, the top surface S166-1 of the patterned conductive layer 166-1 is partially exposed for electrically connecting to later-formed connectors. The formation and material of the dielectric layer 162-2 may be the same or similar to the process and material of forming the dielectric layer 162-1 as described in FIG. 6, and thus are not repeated therein for brevity. In one embodiment, the material of the dielectric layer 162-2 may be the same as the material of the dielectric layer 162-1. In an alternative embodiment, the material of the dielectric layer 162-2 may be different from the material of the dielectric layer 162-1. The disclosure is not limited thereto.

Figure 11:
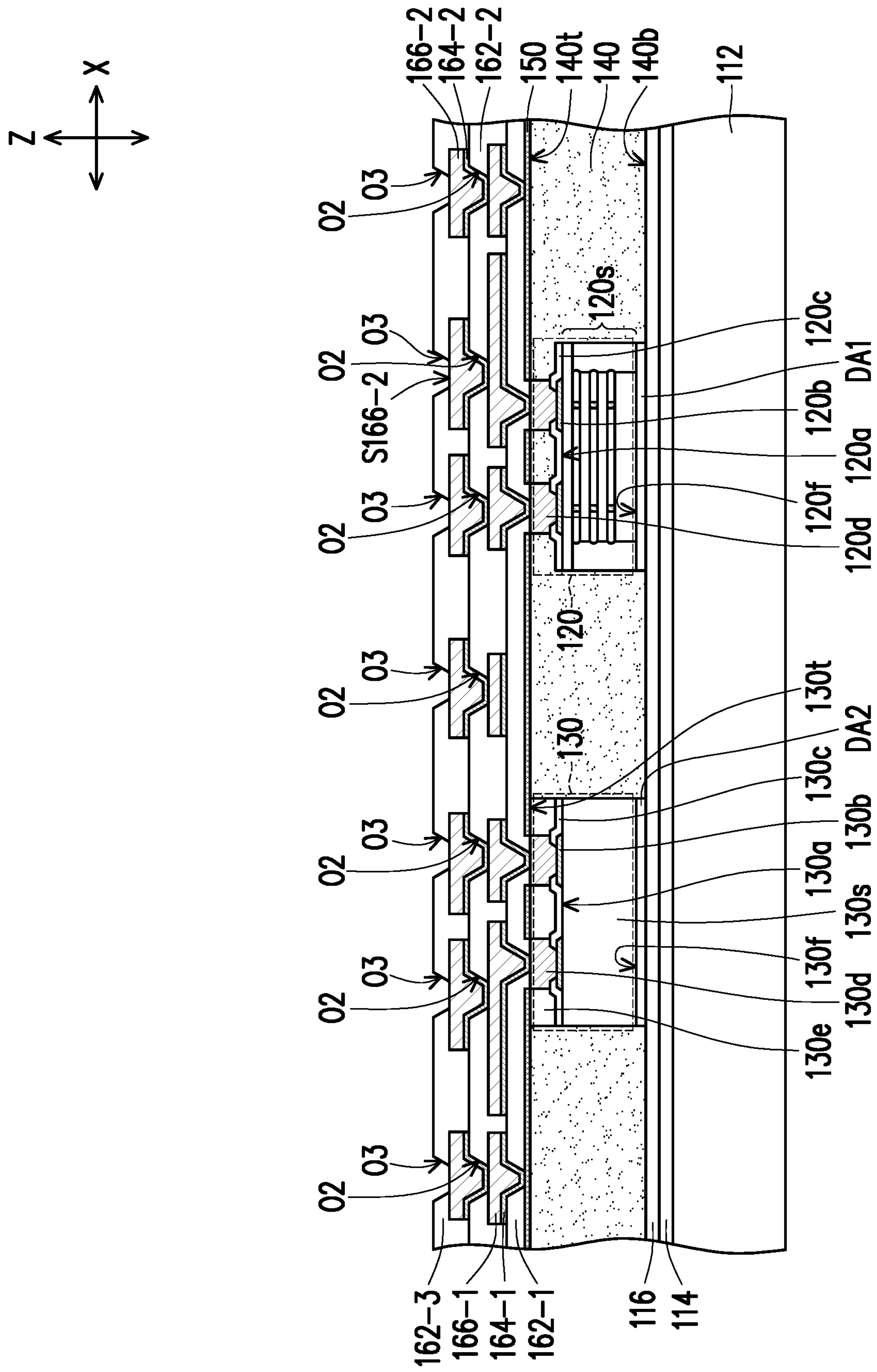

Referring to FIG. 11, in some embodiments, the seed layer 164-2, the patterned conductive layer 166-2 and the dielectric layer 162-3 are sequentially formed on the structure depicted on FIG. 10. The formation and material of the seed layer 164-2 are the same or similar to the process and material of forming the seed layer 164-1 as described in FIG. 7 through FIG. 9, the formation and material of the patterned conductive layer 166-2 are the same or similar to the process and material of forming the patterned conductive layer 166-1 as described in FIG. 8, and the formation and material of the dielectric layer 162-3 are the same or similar to the process and material of forming the dielectric layer 162-1 as described in FIG. 6, and thus are not repeated herein.

In some embodiments, the seed layer 164-2 is formed on the dielectric layer 162-2 and extends into opening holes O2 formed in the dielectric layer 162-2 to physically contact the patterned conductive layer 166-1 exposed by the opening holes O2. In other words, the seed layer 164-2 penetrates through the dielectric layer 162-2, and sidewalls of the opening holes O2 are completely covered by the seed layer 164-2. In some embodiments, the patterned conductive layer 166-2 is formed on (e.g. in physical contact with) the seed layer 164-2, where a projection area of the patterned conductive layer 166-2 is overlapped with a projection area of the seed layer 164-2, in the vertical projection on the insulating encapsulation 140 along the direction Z. That is to say, a sidewall of the seed layer 164-2 is aligned with a sidewall of the patterned conductive layer 166-2. For example, as shown in FIG. 11, the patterned conductive layer 166-2 is electrically connected to the patterned conductive layer 166-1 through the seed layer 164-2. In one embodiment, the material of the seed layer 164-2 may be the same as the material of the seed layer 164-1. In an alternative embodiment, the material of the seed layer 164-2 may be different from the material of the seed layer 164-1. In one embodiment, the material of the patterned conductive layer 166-2 may be the same as the material of the patterned conductive layer 166-1. In an alternative embodiment, the material of the patterned conductive layer 166-2 may be different from the material of the patterned conductive layer 166-1.

In some embodiments, the dielectric layer 162-3 are formed on the patterned conductive layer 166-2 with a plurality of opening holes O3 each exposing a portion of the patterned conductive layer 166-2. As show in FIG. 11, through the opening holes O3, the top surface S166-2 of the patterned conductive layer 166-2 is partially exposed for electrically connecting to later-formed connectors. In one embodiment, the material of the dielectric layer 162-3 may be the same as the material of the dielectric layers 162-1 and 162-2. In an alternative embodiment, the material of the dielectric layer 162-3 may be different from the material of the dielectric layer 162-1 and/or the dielectric layer 162-2.

Figure 12:
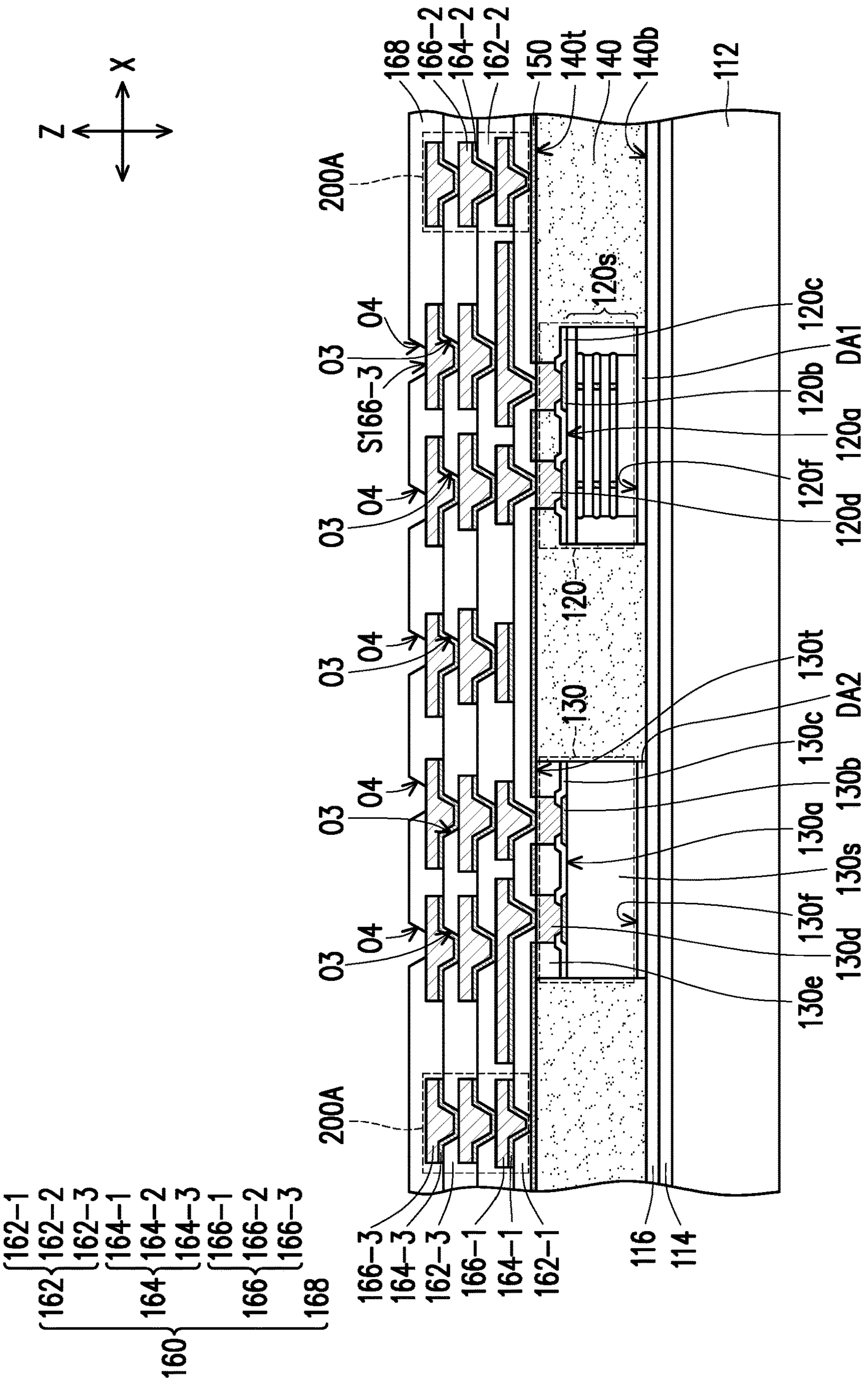

Referring to FIG. 12, in some embodiments, the seed layer 164-3, the patterned conductive layer 166-3, and the dielectric layer 168 are sequentially formed on the structure depicted on FIG. 11. The formation and material of the seed layer 164-3 are the same or similar to the process and material of forming the seed layer 164-1 as described in FIG. 7 through FIG. 9, the formation and material of the patterned conductive layer 166-3 are the same or similar to the process and material of forming the patterned conductive layer 166-1 as described in FIG. 8, and the formation and material of the dielectric layer 168 are the same or similar to the process and material of forming the dielectric layer 162-1 as described in FIG. 6, and thus are not repeated herein.

In some embodiments, the seed layer 164-3 is formed on the dielectric layer 162-3 and extends into opening holes O3 formed in the dielectric layer 162-3 to physically contact the patterned conductive layer 166-2 exposed by the opening holes O3. In other words, the seed layer 164-3 penetrates through the dielectric layer 162-3, and sidewalls of the opening holes O3 are completely covered by the seed layer 164-3. In some embodiments, the patterned conductive layer 166-3 is formed on (e.g. in physical contact with) the seed layer 164-3, where a projection area of the patterned conductive layer 166-3 is overlapped with a projection area of the seed layer 164-3, in the vertical projection on the insulating encapsulation 140 along the direction Z. That is to say, a sidewall of the seed layer 164-2 is aligned with a sidewall of the patterned conductive layer 166-2. For example, as shown in FIG. 12, the patterned conductive layer 166-3 is electrically connected to the patterned conductive layer 166-2 through the seed layer 164-3. In one embodiment, the material of the seed layer 164-3 may be the same as the material of the seed layers 164-1 and 164-2. In an alternative embodiment, the material of the seed layer 164-3 may be different from the material of the seed layer 164-1 and/or the seed layer 164-2. In one embodiment, the material of the patterned conductive layer 166-3 may be the same as the material of the patterned conductive layers 166-1 and 166-2. In an alternative embodiment, the material of the patterned conductive layer 166-3 may be different from the material of the patterned conductive layer 166-1 and/or the patterned conductive layer 166-2.

In some embodiments, the dielectric layer 168 are formed on the patterned conductive layer 166-3 with a plurality of opening holes O4 each exposing a portion of the patterned conductive layer 166-3. As show in FIG. 12, through the opening holes O4, the top surface S166-3 of the patterned conductive layer 166-3 is partially exposed for electrically connecting to later-formed connectors. In one embodiment, the material of the dielectric layer 168 may be the same as the material of the dielectric layers 162-1 through 162-3. In an alternative embodiment, the material of the dielectric layer 162-3 may be different from the material of the dielectric layer 162-1, the dielectric layer 162-2 and/or the dielectric layer 162-3. Upon this, the redistribution circuit structure 160 is manufactured.

In the disclosure, the material of each of the dielectric layers 162-1 through 162-3 is different from the material of the insulating encapsulation 140 and the material of the protection layer 130*e* of the semiconductor die 130. In some embodiments, the material of each of the dielectric layers 162-1 through 162-3 is also different from the material of the surface-modifying film 150. Due to the surface-modifying film 150 is sandwich between the insulating encapsulation 140 and a bottommost dielectric layer (e.g., 162-1) of the redistribution circuit structure 160 and between the protection layer 130*e* of the semiconductor die 130 and the bottommost dielectric layer (e.g., 162-1) of the redistribution circuit structure 160, the adhesion strength between the insulating encapsulation 140 and the redistribution circuit structure 160 and the adhesion strength between the protection layer 130*e* of the semiconductor die 130 and the redistribution circuit structure 160 are significantly enhanced, and the delamination between the insulating encapsulation 140 and the redistribution circuit structure 160 and between the protection layer 130*e* of the semiconductor die 130 and the redistribution circuit structure 160 is suppressed.

As illustrated in FIG. 12, for example, the redistribution circuit structure 160 is formed on the surface-modifying film 150 and over the semiconductor dies 120, 130 and the insulating encapsulation 140, where the redistribution circuit structure 160 is electrically connected to the semiconductor dies 120 and 130. In other words, the semiconductor dies 120 and 130 are electrically communicated to each through the redistribution circuit structure 160. The redistribution circuit structure 160 may be referred to as a front-side redistribution layer of the semiconductor dies 120 and 130 for providing routing function. Owing to the surface-modifying film 150, the reliability of the electrical connections among the semiconductor dies 120, 130 and the redistribution circuit structure 160 is ensured.

In the disclosure, a set of the layers (e.g. the dielectric layer 162-1, the seed layer 164-1 and the patterned conductive layer 166-1) formed in FIG. 6 through FIG. 9, a set of the layers (e.g. the dielectric layer 162-2, the seed layer 164-2 and the patterned conductive layer 166-2) formed in FIG. 10 through FIG. 11, and a set of the layers (e.g. the dielectric layer 162-3, the seed layer 164-3 and the patterned conductive layer 166-3) formed in FIG. 11 through FIG. 12 may be individually referred to as a build-up layer of the redistribution circuit structure 160, while the dielectric layer 168 formed in FIG. 12 may be referred to as a passivation layer of the redistribution circuit structure 160 for providing protection to the underneath build-up layers. For illustration purpose, three build-up layers are included in the redistribution circuit structure 160 of FIG. 12; however, the disclosure is not limited thereto. The number of the build-up layer included in the redistribution circuit structure 160 is not limited in the disclosure, and may be selected based on the demand and design layout. That is, the number of the build-up layer included in the redistribution circuit structure 160 may be one or more than one as long as the redistribution circuit structure 160 can provide a sufficient routing function to the semiconductor dies 120 and 130.

Continued on FIG. 12, a seal ring structure 200A is formed in the redistribution circuit structure 160. For example, as shown in FIG. 12, portions of the patterned conductive layer 166 and portions of the seed layer 164 respectively connected thereto, which are located close to but not on cutting lines CL (depicted in FIG. 14), together constitute the seal ring structure 200A. In some embodiments, the seal ring structure 200A is electrically isolated with the semiconductor dies 120, 130 and the rest of the patterned conductive layer 166 and the rest of the seed layer 164 of the redistribution circuit structure 160. As shown in FIG. 12, for example, an illustrated top surface (not labeled) of the seal ring structure 200A is covered by and in physical contact with the dielectric layer 168 of the redistribution circuit structure and an illustrated bottom surface (not labeled) of the seal ring structure 200A is covered by and in physical contact with the surface-modifying film 150. In other words, the seal ring structure 200A penetrates through the dielectric layer 162-1.

In some embodiments, the seal ring structure 200A includes a ring pattern surrounding the rest of the patterned conductive layers 166 and the seed layer 164 of the redistribution circuit structure 160 not electrically coupled therewith. Due to the seal ring structure 200A, not only a better supporting strength is provided to the package structure, but the redistribution circuit structure 160, which provides the routing function of the semiconductor dies 120 and 130, is also protected from moisture and/or vapor of the external environment.

Figure 13:
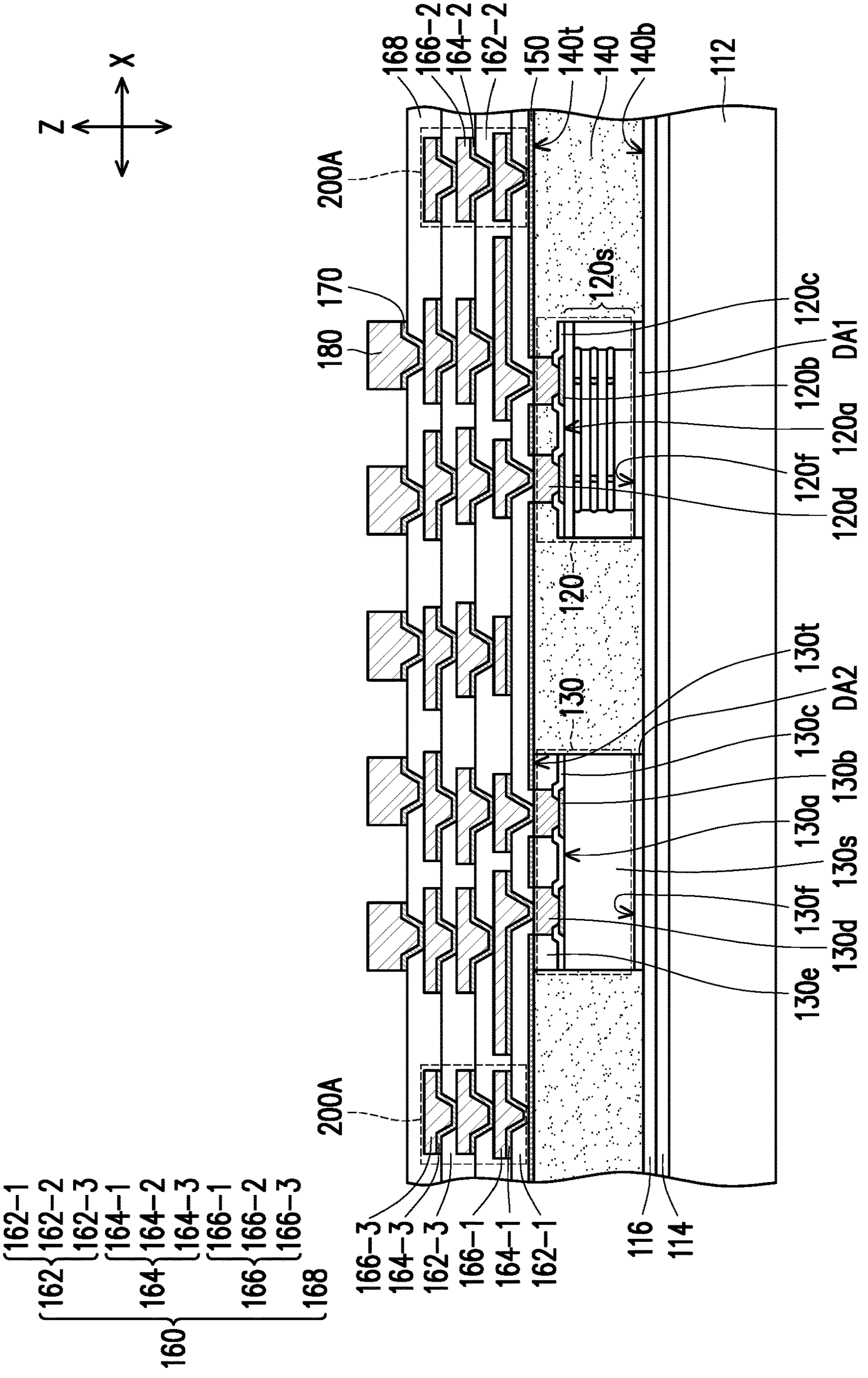

Referring to FIG. 13, in some embodiments, a plurality of seed-layer patterns 170 and a plurality of conductive elements 180 are formed over the redistribution circuit structure 160. In some embodiments, as shown in FIG. 13, the seed-layer patterns 170 each are located between a respective one of the conductive elements 180 and the dielectric layer 168 of the redistribution circuit structure 160. Due to the seed-layer patterns 170, the adhesion strength between the conductive elements 180 and the dielectric layer 168 is enhanced. In some embodiments, the seed-layer patterns 170 are directly located on the portions of the patterned conductive layer 166-3 exposed by the opening holes O4 formed in the dielectric layer 168. As shown in FIG. 13, in some embodiments, the seed-layer patterns 170 are electrically connected to the redistribution circuit structure 160, and the conductive elements 180 are electrically connected to the redistribution circuit structure 160 through the seed-layer patterns 170. In some embodiments, the conductive elements 180 are electrically connected to the semiconductor dies 120, 130 through the redistribution circuit structure 160 and the seed-layer patterns 170. For example, some of the conductive elements 180 are electrically connected to the semiconductor die 120 through the redistribution circuit structure 160 and respective ones of the seed-layer patterns 170. For example, some of the conductive elements 180 are electrically connected to the semiconductor die 130 through the redistribution circuit structure 160 and respective ones of the seed-layer patterns 170.

In some embodiments, the seed-layer patterns 170 are formed by, but not limited to, forming a blanket layer of a seed layer material (not shown) on the dielectric layer 168, forming the conductive elements 180 on the seed layer material blanket layer, patterning the seed layer material blanket layer by using the conductive elements 180 as a mask. In some embodiments, the seed layer material blanket layer is formed on the dielectric layer 168 and extends into the opening holes O4 formed in the dielectric layer 168 to physically and electrically contact the patterned conductive layer 166-3 exposed by the opening holes O4. In other words, the seed layer material blanket layer penetrates through the dielectric layer 168, and sidewalls of the opening holes O4 are completely covered by the seed layer material blanket layer. The formation and material of the seed layer material blanket layer are the same or similar to the formation and material of the seed layer 164*a*, and thus is not repeated herein.

In some embodiments, the formation of the conductive elements 180 may be formed by forming a patterned photoresist layer (not shown) having openings exposing portions of the seed layer material blanket layer by photolithography, and immersing the whole structure including the patterned photoresist layer formed thereon into a plating solution so as to plate the conductive elements 180 on the seed layer material blanket layer corresponding in position to the portions of the seed layer material blanket layer exposed by the openings formed in the patterned photoresist layer. In one embodiment, the patterned photoresist layer may be formed by coating and photolithography processes or the like. In some embodiments, a material of patterned photoresist layer, for example, includes a positive resist material or a negative resist material, that is suitable for a patterning process such as a photolithography process with a mask or a mask-less photolithography process (for instance, an electron-beam (e-beam) writing or an ion-beam writing). Due to the patterned photoresist layer, the size and number of the conductive elements 180 can be easily modified by adjusting the size and number of the openings in the patterned photoresist layer. In some embodiments, the conductive elements 180 are metal pillars, controlled collapse chip connection (C4) bumps, micro bumps, electroless nickel-electroless palladium-immersion gold technique (ENEPIG) formed bumps, or the like. As shown in FIG. 13, the conductive elements 180, for example, includes copper pillars or copper bumps.

After the conductive elements 180 are formed, the patterned photoresist layer is removed to expose the seed layer material blanket layer not covered by the conductive elements 180. In one embodiment, the patterned photoresist layer is removed by acceptable ashing process and/or photoresist stripping process, such as using an oxygen plasma or the like, and the disclosure is not limited thereto.

In some embodiments, the seed layer material blanket layer is patterned by using the conductive elements 180 as an etching mask to form the seed-layer patterns 170. For example, the etching process may be a dry etching process, a wet etching process, or a combination thereof; the disclosure is not limited thereto. In other words, the seed layer material blanket layer not covered by the conductive elements 180 are removed to form the seed-layer patterns 170. In some embodiments, as shown in FIG. 13, sidewalls of the seed-layer patterns 170 are aligned with sidewalls of a respective one of the conductive elements 180.

Figure 14:
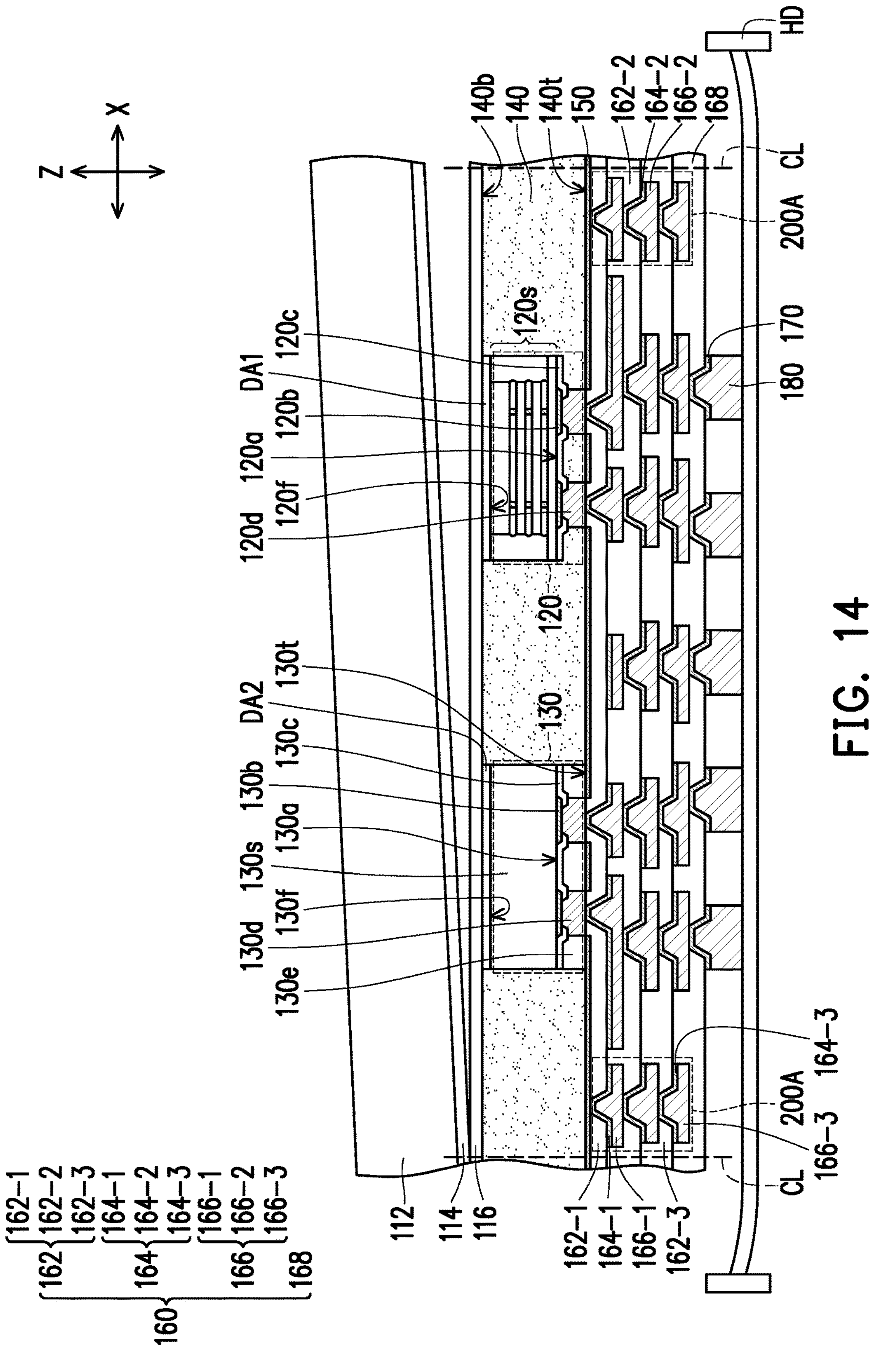

Referring to FIG. 14, in some embodiments, the whole structure depicted in FIG. 13 along with the carrier 112 is flipped (turned upside down), where the conductive elements 180 are placed to a holding device HD, and the carrier 112 is then debonded from the buffer layer 116. In some embodiments, the holding device HD may be an adhesive tape, a carrier film or a suction pad being supported by a frame. The disclosure is not limited thereto. In some embodiments, the buffer layer 116 is easily separated from the carrier 112 due to the debond layer 114. In some embodiments, the carrier 112 is detached from the buffer layer 116 through a debonding process, and the carrier 112 and the debond layer 114 are removed. In certain embodiments, the buffer layer 116 is exposed, as show in FIG. 14. In one embodiment, the debonding process is a laser debonding process. During the debonding step, the holding device HD is used to secure the structure depicted in FIG. 13 before debonding the carrier 112 and the debond layer 114.

However, the disclosure is not limited thereto. Alternatively, after debonding the carrier 112, a removal process of the buffer layer 116 may further be performed to expose the bottom surface 140*b* of the insulating encapsulation 140 and the surfaces of the bonding films DA1, DA2 coplanar to the bottom surface 140*b*.

Figure 15:
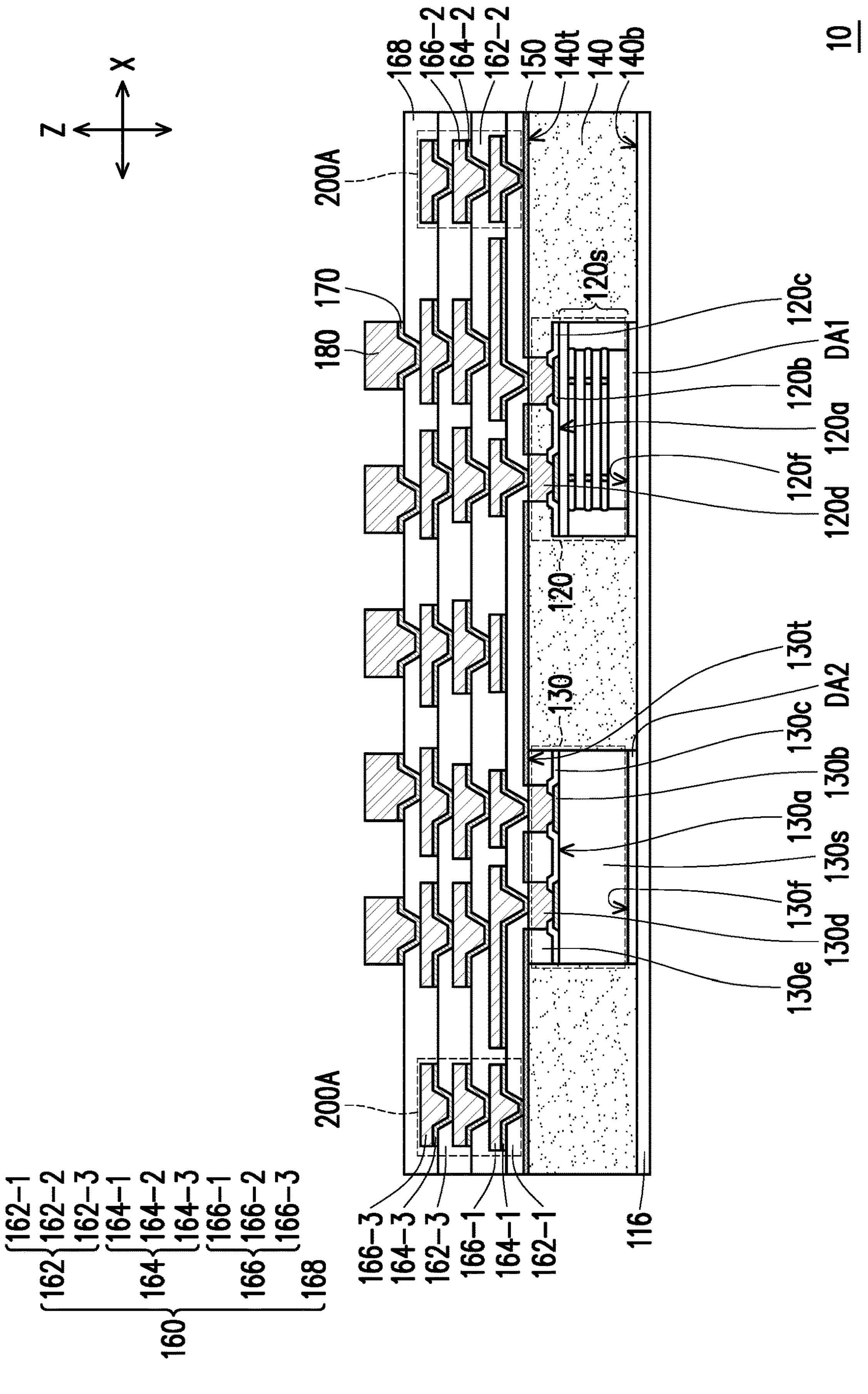
Figure 16B:
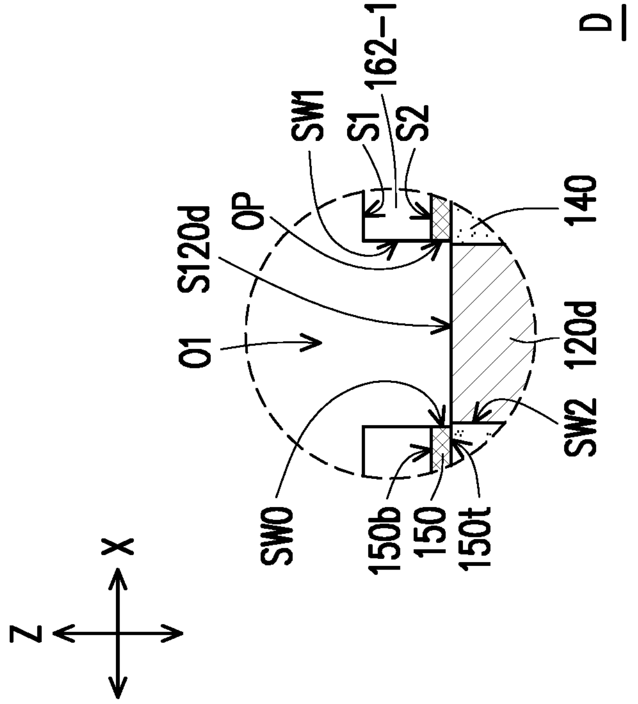
FIG. 16B is an enlarged, schematic cross-sectional view of a portion of a package structure in accordance with some embodiments of the disclosure.
Figure 16A:
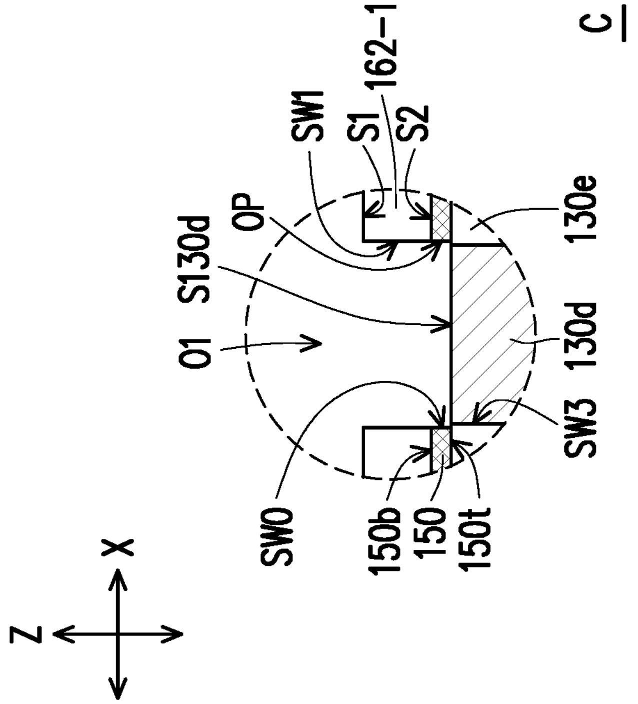
FIG. 16A is an enlarged, schematic cross-sectional view of a portion of a package structure in accordance with some embodiments of the disclosure.

Referring to FIG. 14 and FIG. 15, in some embodiments, the conductive elements 180 are released from the holding device HD to form a package structure 10. In some embodiments, prior to releasing the conductive elements 180 from the holding device HD, a dicing (singulation) process is performed along dicing lines CL to cut a plurality of the package structure 10 interconnected therebetween into individual and separated package structure 10. In one embodiment, the dicing (singulation) process is a wafer dicing process including mechanical blade sawing or laser cutting. The disclosure is not limited thereto. Up to here, the manufacture of the package structure 10 is completed. The package structures 10 are referred to as integrated fan-out (InFO) packages.

However, the disclosure is not limited thereto. In alternative embodiments, the conductive elements 180 may include solder balls or ball grid array (BGA) balls, see a package structure 20 depicted in FIG. 17. In other alternative embodiments, a plurality of conductive pillars 190 may be further included, see a package structure 30 depicted in FIG. 18.

Figure 17:
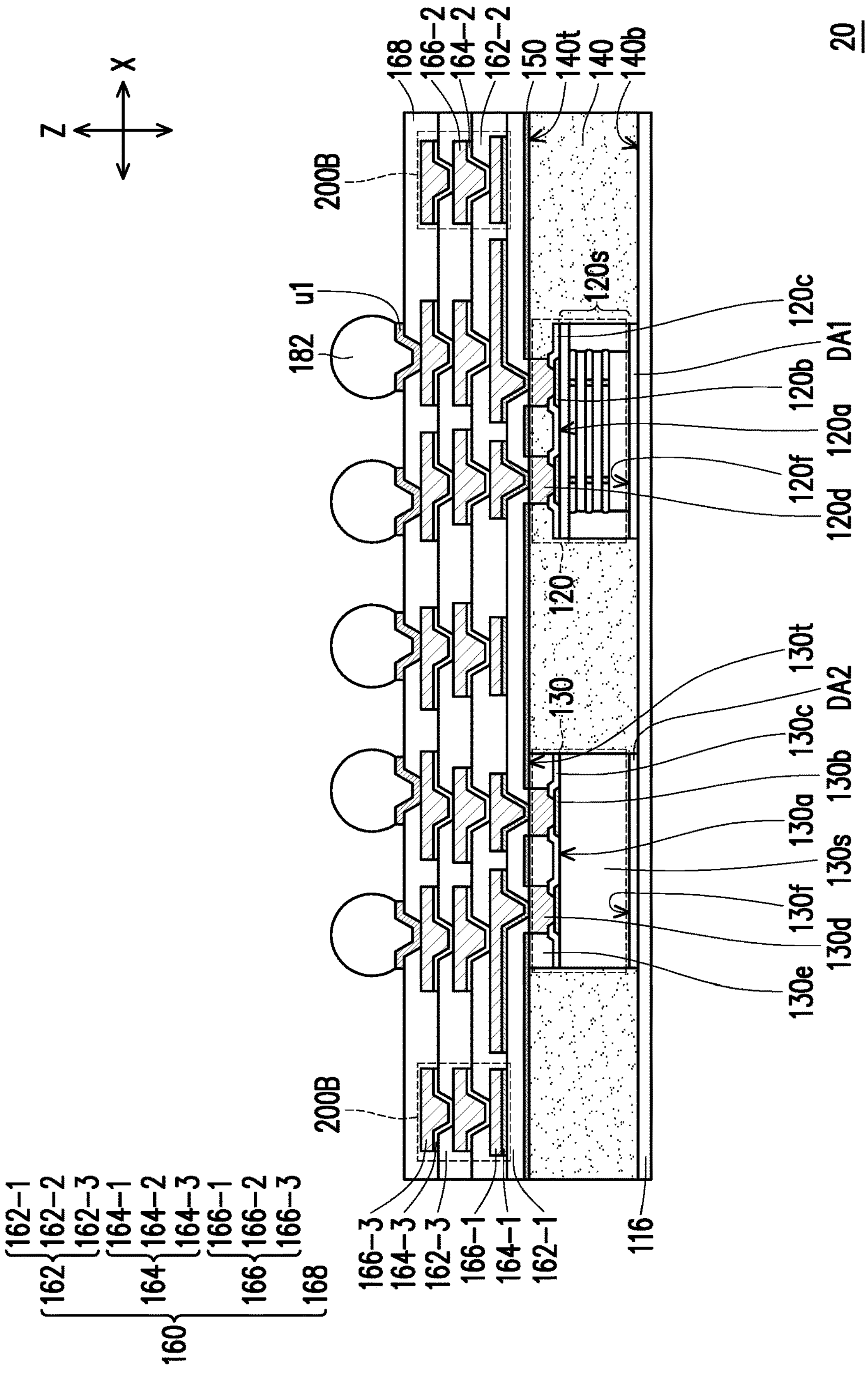
FIG. 17 is a schematic cross-sectional view of a package structure in accordance with some embodiments of the disclosure.
Figure 19:
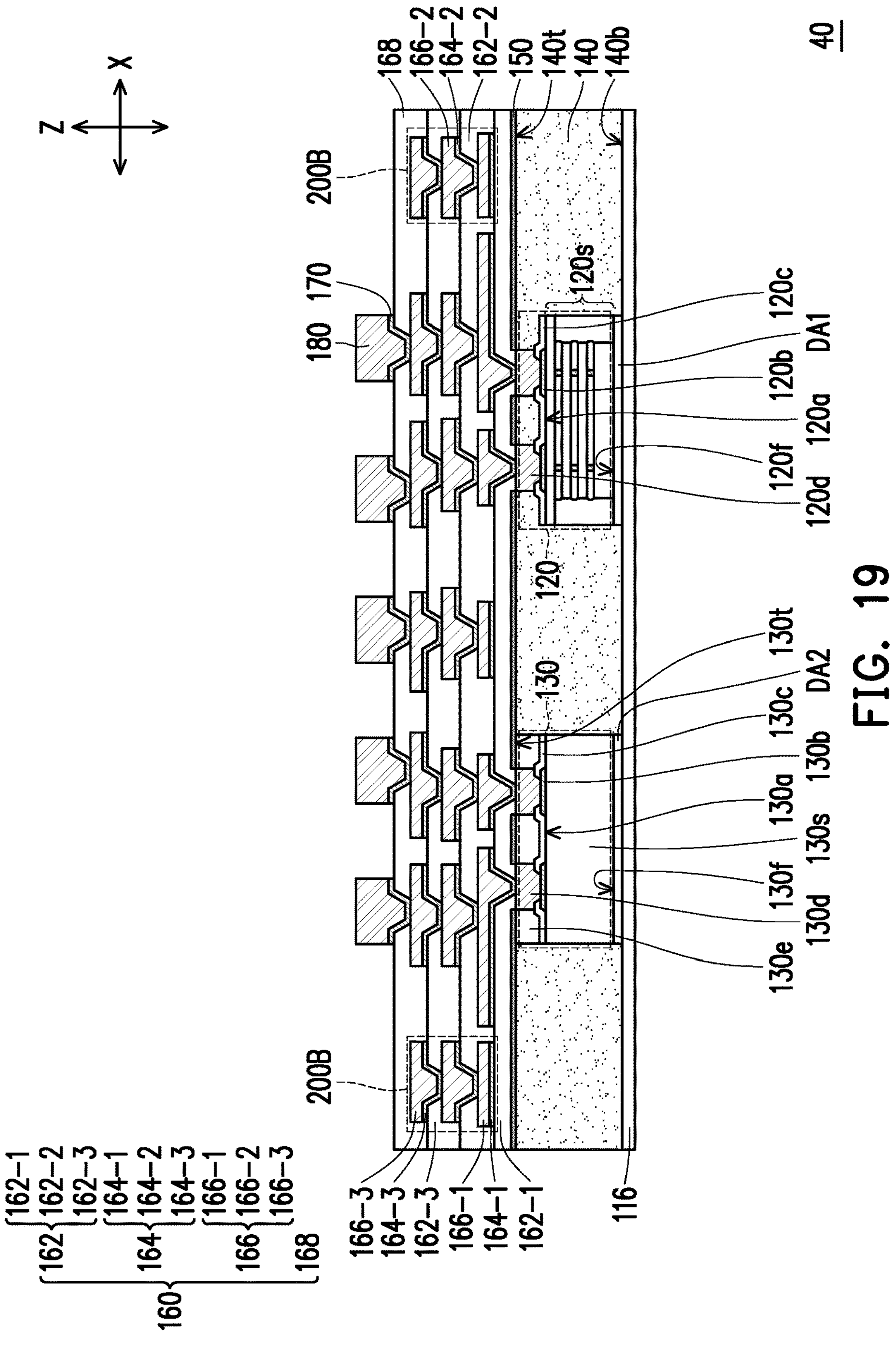
FIG. 19 is a schematic cross-sectional view of a package structure in accordance with some embodiments of the disclosure.

FIG. 17 is a schematic cross-sectional view of a package structure in accordance with some embodiments of the disclosure. Referring to FIG. 15 and FIG. 17 together, the package structure 10 depicted in FIG. 15 and the package structure 20 depicted in FIG. 17 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. With such embodiment of which the conductive elements 180 are replaced with conductive elements 182 including solder balls or BGA balls as shown in FIG. 19, the seed layer patterns 160 are replaced with under-ball metallurgy (UBM) patterns u1 to avoid the solder material diffusing from the conductive elements 182 to the redistribution circuit structure 160, thereby ensuring the performance of the package structure 20. In some embodiments, the materials of the UBM patterns u1 may include copper, nickel, titanium, tungsten, or alloys thereof or the like, and may be formed in a manner of a multi-layer (e.g. with different materials in any two adjacent layers in the UBM patterns u1) by an electroplating process, for example. The number of the UBM patterns u1 is not limited in this disclosure.

Figure 18:
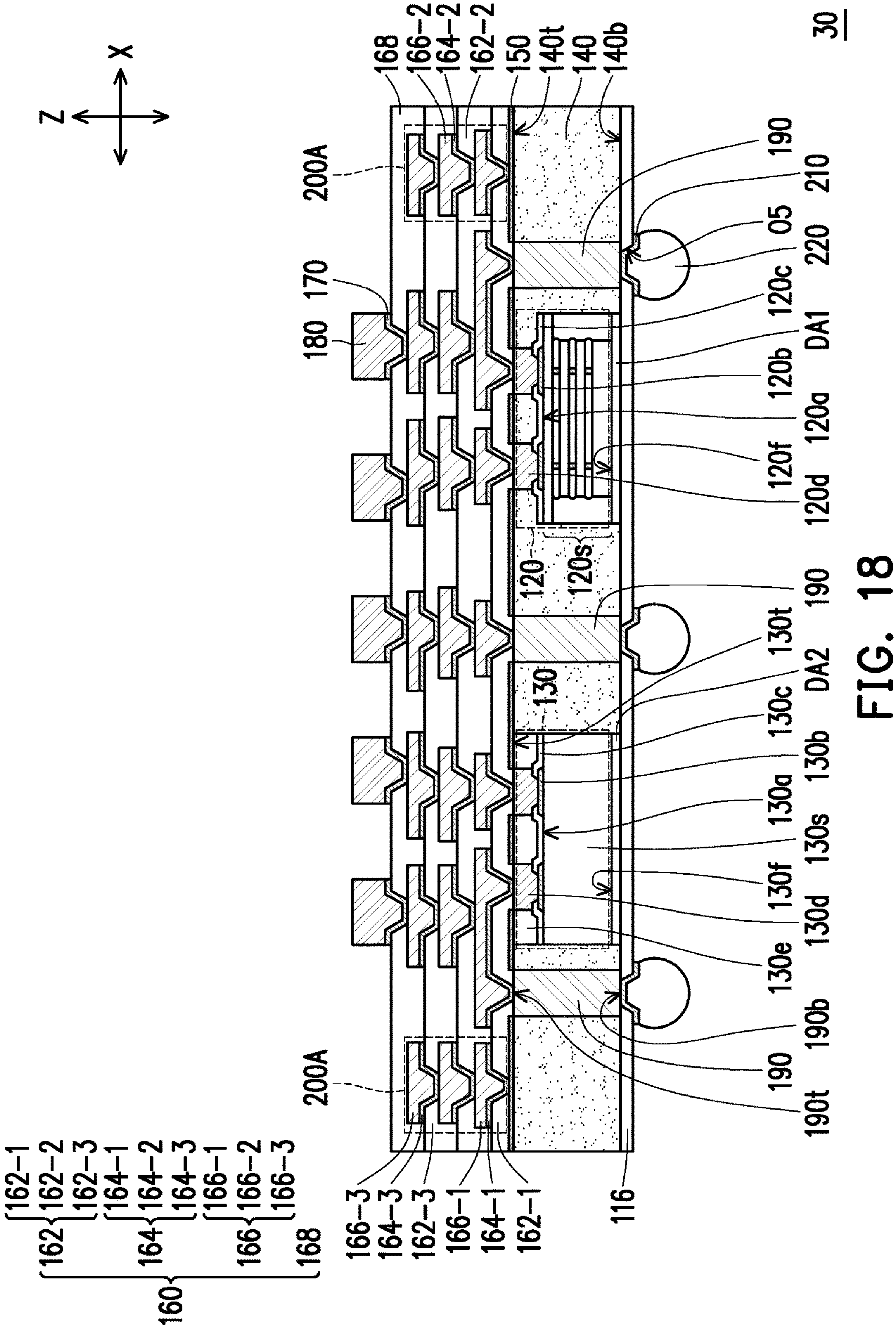
FIG. 18 is a schematic cross-sectional view of a package structure in accordance with some embodiments of the disclosure.

FIG. 18 is a schematic cross-sectional view of a package structure in accordance with some embodiments of the disclosure. Referring to FIG. 15 and FIG. 18 together, the package structure 10 depicted in FIG. 15 and the package structure 30 depicted in FIG. 18 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. With such embodiment of which the conductive pillars 190 are included as shown in FIG. 18, where the conductive pillars 190 are arranged aside of the semiconductor dies 120, 130 along the direction X and are embedded in the insulating encapsulation 140. In some embodiments, the conductive pillars 190 may be through-interlayer-vias or through-insulator-vias, such as through integrated fan-out (InFO) vias. For simplification, only three conductive pillars 190 are presented in FIG. 18 for illustrative purposes, however it should be noted that the number of the conductive pillars 190 may be less than one or more than one; the disclosure is not limited thereto. The number of the conductive pillars 190 to be formed can be selected based on the demand.

In some embodiments, two ends of each of the conductive pillars 190 are exposed by the insulating encapsulation 140, where a first end of each of the conductive pillars 190, which is nearest to the redistribution circuit structure 160, is also exposed by the surface-modifying film 150. For example, the conductive pillars 190 are sandwiched between the buffer layer 116 and the redistribution circuit structure 160, where the first ends of the conductive pillars 190 exposed by the surface-modifying film 150 is connected to the redistribution circuit structure 160, and the conductive pillars 190 are electrically connected to the semiconductor dies 120 and 130 through the redistribution circuit structure 160. For example, the conductive pillars 190 are formed on the buffer layer 116 by photolithography, plating, photoresist stripping processes or any other suitable method. In one embodiment, the conductive pillars 190 may be formed by, but not limited to, forming a mask pattern (not shown) covering the buffer layer 116 with openings exposing portions of the buffer layer 116, forming a metallic material filling the openings to form the conductive pillars 190 by electroplating or deposition, and then removing the mask pattern. For example, the material of the conductive pillars 190 may include a metal material such as copper or copper alloys, or the like. However, the disclosure is not limited thereto.

Continued on FIG. 18, in some embodiments, a plurality of opening holes O5 are formed in the buffer layer 116 to exposing a second end of each of the conductive pillars 190. In some embodiments, the opening holes O5 of the buffer layer 116 is formed by laser drilling process. The number of the opening holes O5 is not limited in the disclosure, and may be designated based on the demand and design layout. In certain embodiments, a plurality of conductive elements 220 are respectively formed on the second end of each of the conductive pillars 190 exposed by the opening holes O5, and a plurality of UBM patterns u2 are respectively formed to be located between one of the conductive pillars 190 and a respective one of the conductive elements 220. However, the disclosure is not limited thereto, in alternative embodiments, the UBM patterns u2 may be omitted based on the design layout and demand. The formation and material of the conductive elements 220 are the same or similar to the formation and material of the conductive elements 192 as described in FIG. 17, and formation and material of the UBM patterns u2 are the same or similar to the formation and material of the UBM patterns u1 as described in FIG. 17, and thus are not repeated herein. As shown in FIG. 18, the conductive elements 220 are electrically connected to the semiconductor dies 120 and 130 through the UBM patterns u2, the conductive pillars 190 and the redistribution circuit structure 160. For example, after the conductive elements 220 are disposed on the conductive pillars 190, the package structure 30 is accomplished as an InFO package having dual-side terminals.

In further alternative embodiments, in addition to the conductive elements 180 included in FIG. 15 and FIG. 18 and/or the conductive elements 182 included in FIG. 17, an additional semiconductor element(s) (not shown) may be disposed on the redistribution circuit structure 160 through the seed layer patterns 160 and/or the UBM patterns u1, u2 for electrically connecting to at least one of the semiconductor dies 120, 130. In some embodiments, the additional semiconductor element(s) may include a passive component or active component. The number of the additional semiconductor element(s) is not limited in the disclosure, and may be designated based on the demand and design layout.

FIG. 19 is a schematic cross-sectional view of a package structure in accordance with some embodiments of the disclosure. The elements similar to or substantially the same as the elements described previously will use the same reference numbers, and certain details or descriptions of the same elements would not be repeated herein. Referring to FIG. 15 and FIG. 19, a package structure 40 depicted in FIG. 19 is similar to the package structure 10 depicted in FIG. 15; the difference is that, in the package structure 40, the seal ring structure 200A is replaced by a seal ring structure 200B. In some embodiments, the seal ring structure 200B does not penetrate through the dielectric layer 162-1. As shown in FIG. 19, for example, an illustrated top surface (not labeled) of the seal ring structure 200A is covered by and in physical contact with the dielectric layer 168 of the redistribution circuit structure and an illustrated bottom surface (not labeled) of the seal ring structure 200A is covered by and in physical contact with the dielectric layer 162-1. The seal ring structure 200B provides not only the better supporting strength and the protection from the moisture and/or vapor to the package structure 40, but also reduces the stress applied at interface of the redistribution circuit structure 160 and the surface-modifying film 150; thereby suppressing the delamination at the interface inside the package structure 40.

Throughout the disclosure, although the seal ring structure 200A and the seal ring structure 200B independently include the portion of the patterned conductive layers 166 and the seed layers 164 connected thereto and located close to but not on the cutting lines CL (depicted in FIG. 14), where the patterned conductive layers 166 and the seed layers 164 arranged in different layers in each of the seal ring structure 200A and the seal ring structure 200B are arranged in the way of a line-up structure (e.g., with aligned sidewalls) in a vertical cross-section along the direction Z, the disclosure is not limited thereto. Alternatively, the patterned conductive layers 166 and the seed layers 164 arranged in different layers in each of the seal ring structure 200A and the seal ring structure 200B are arranged in the way of a stagger structure in the vertical cross-section along the direction Z, where sidewalls of the patterned conductive layers 166 and the seed layers 164 in one layer are offset from sidewalls of the patterned conductive layers 166 and the seed layers 164 in another layer immediately underlying or overlying thereto. It is appreciated that a pair of the patterned conductive layers 166 and the seed layers 164, which are in direct contact with each other and sandwiched by two immediately adjacent dielectric layers 162, are considered as one layer of each of the seal ring structure 200A and the seal ring structure 200B.

In some embodiments, the package structures 10-40 may be further mounted with a (semiconductor) circuit substrate (e.g. an organic substrate with circuitry structure embedded therein, such as printed circuit board (PCB)), an interposer, an additional package, chips/dies or other electronic devices, to form a stacked package structure, the disclosure is not limited thereto. For illustration, an example is provided as follows, but the disclosure is not limited thereto.

Figure 20:
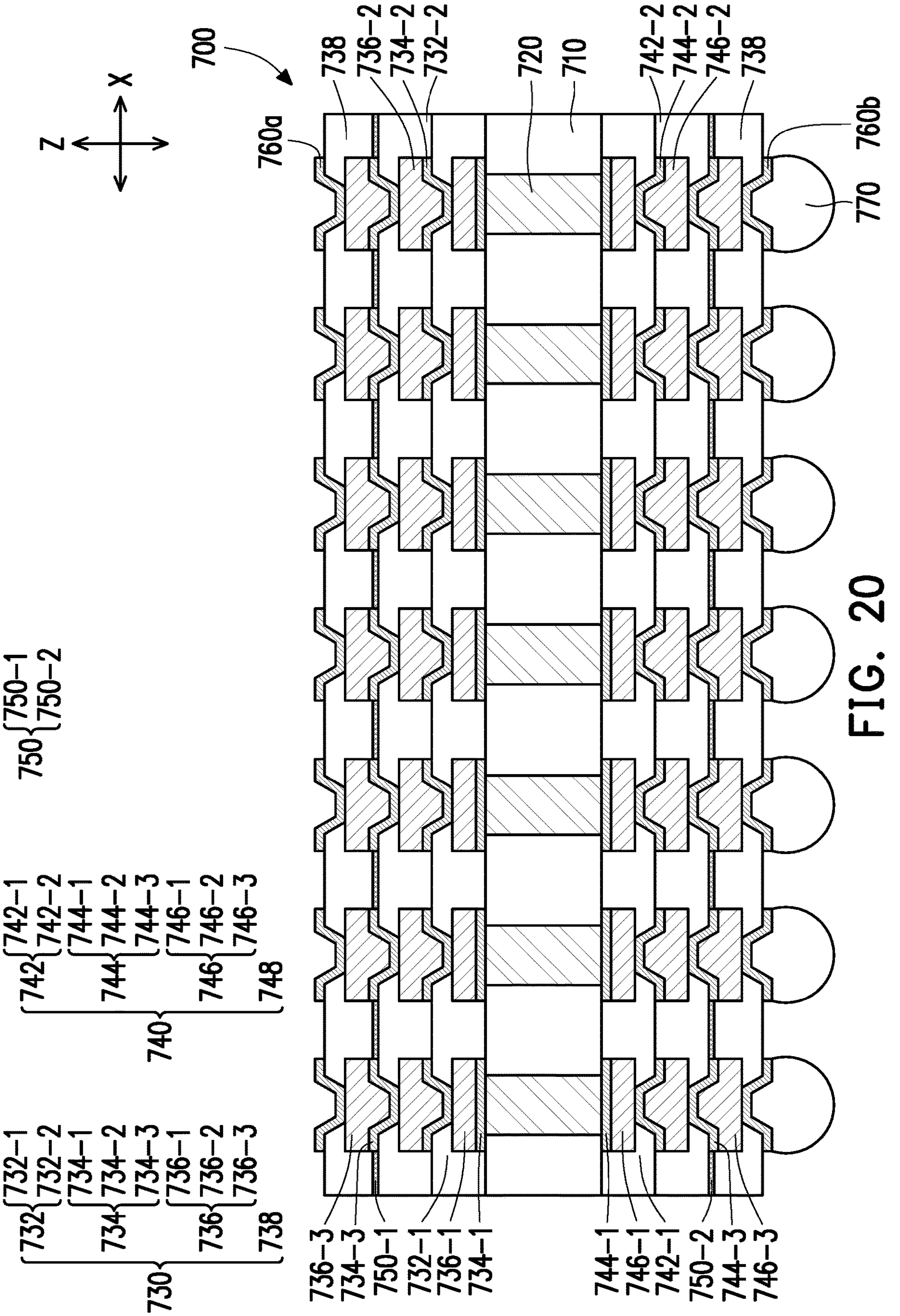
FIG. 20 through FIG. 21 are schematic cross-sectional views of various stages in a manufacturing method of a package structure in accordance with some embodiments of the disclosure.
Figure 21:
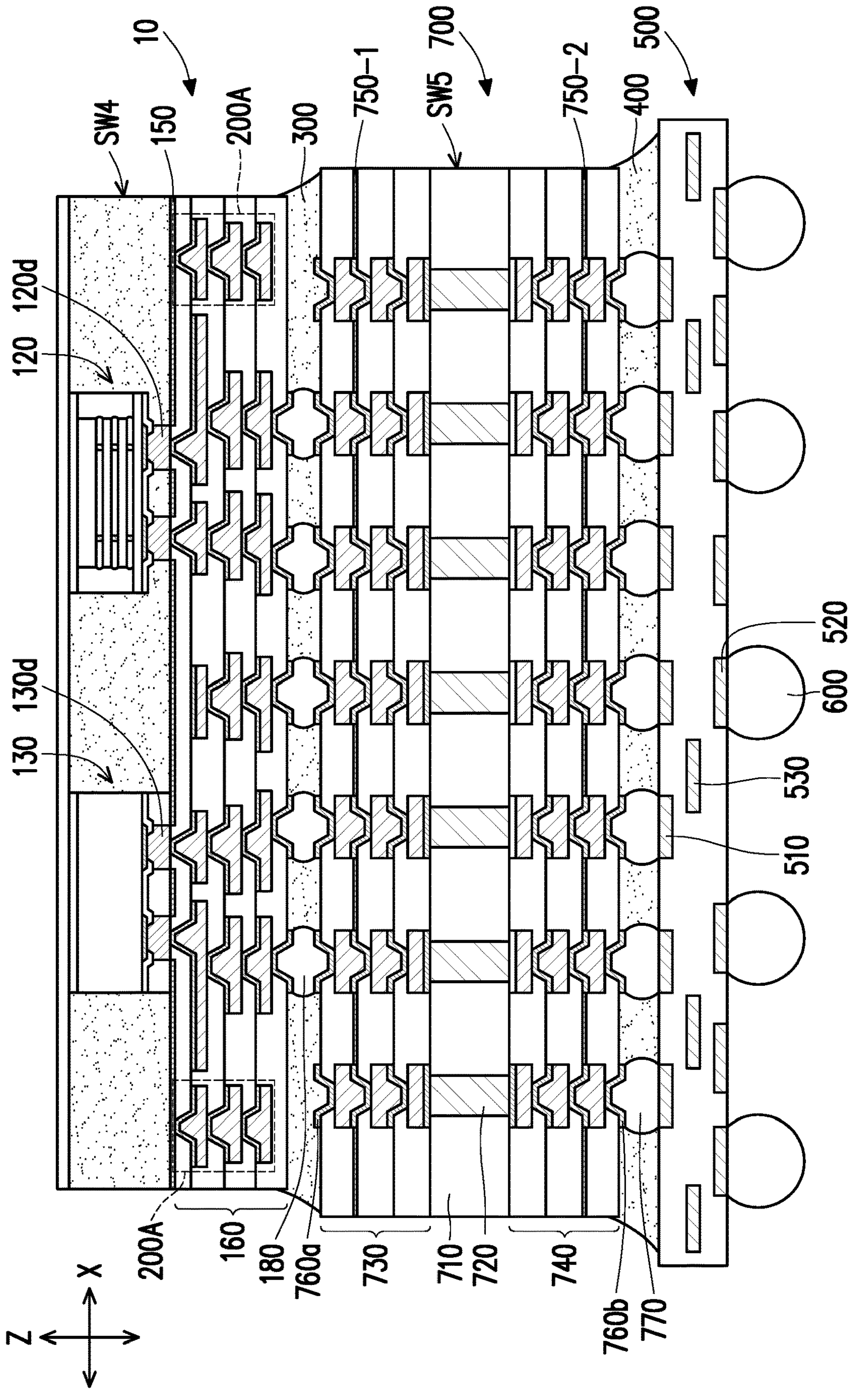

FIG. 20 through FIG. 21 are schematic cross-sectional views of various stages in a manufacturing method of a package structure in accordance with some embodiments of the disclosure. The elements similar to or substantially the same as the elements described previously will use the same reference numbers, and certain details or descriptions (e.g. the materials, formation processes, positioning configurations, etc.) of the same elements would not be repeated herein. Referring to FIG. 20, in some embodiments, an interposer 700 is provided. In some embodiments, the interposer 700 includes a core portion 710, a plurality of vias 720, a redistribution circuit structure 730, a redistribution circuit structure 740, a surface-modifying film 750 (e.g. a surface-modifying film 750-1 and a surface-modifying film 750-2), a plurality of bonding pads 760*a*, a plurality of bonding pads 760*b* and a plurality of conductive elements 770.

In some embodiments, the core portion 710 may include a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. In some embodiments, the vias 720 is through silicon vias penetrating the core portion 710.

In some embodiments, the redistribution circuit structure 730 and the redistribution circuit structure 740 respectively disposed on two opposite sides of the core portion 710, as shown in FIG. 20. In some embodiments, the redistribution circuit structure 730 and/or the redistribution circuit structure 740 are electrically connected to the vias 720 penetrating the core portion 710. As shown in FIG. 20, the core portion 710 with the vias 720 penetrating therethrough is located between the redistribution circuit structure 730 and the redistribution circuit structure 740, in some embodiments. Through the vias 720, the redistribution circuit structure 730 and the redistribution circuit structure 740 are electrically connected to each other.

In some embodiments, the redistribution circuit structure 730 includes a dielectric layer 732 (e.g. a dielectric layer 732-1 and a dielectric layer 732-2), a seed layer 734 (e.g. a seed layer 734-1, a seed layer 734-2 and a seed layer 734-3), a patterned conductive layer 736 (e.g. a patterned conductive layer 736-1, a patterned conductive layer 736-2 and a patterned conductive layer 736-3), and a dielectric layer 738. In some embodiments, as shown in FIG. 20, portions of an illustrated top surface of the patterned conductive layer 736-3 are respectively exposed by opening holes formed in the dielectric layer 738 for connecting with other conductive features (e.g. some of the bonding pads 760*a*), and portions of an illustrated bottom surface of the seed layer 734-1 are connecting with the vias 720. Through the redistribution circuit structure 730, some of the bonding pads 760*a* are electrically coupled to the vias 720 embedded in the core portion 710.

In the disclosure, a set of the layers including the dielectric layer 732-1, the seed layer 734-1 and the patterned conductive layer 736-1 and a set of the layers including the dielectric layer 732-2, the seed layer 734-2 and the patterned conductive layer 736-2 may be individually referred to as one inner build-up layer of the redistribution circuit structure 730, while a set of the layers including the seed layer 734-2 and the patterned conductive layer 736-2 may be referred to as one outermost build-up layer of the redistribution circuit structure 730. In addition, the dielectric layer 738 may be referred to as a passivation layer of the redistribution circuit structure 730 for providing protection to the build-up layers underlying thereto. For illustrative purposes, there are two inner build-up layers underneath the outermost build-up layer of the redistribution circuit structure 730; however, the disclosure is not limited thereto. The number of the inner build-up layer included in the redistribution circuit structure 730 may be one or more than one based on the demand and the design layout.

The redistribution circuit structure 730 may be formed with the similar method of forming the redistribution circuit structure 160 as described in FIG. 6 through FIG. 12. The formation of and material of the dielectric layer 732 (e.g., 732-1 through 732-2) may be the same or similar to the process and material of forming the dielectric layer 162-1 as described in FIG. 6, the formation of and material of the seed layer 734 (e.g. 734-1 through 734-3) may be the same or similar to the process and material of forming the seed layer 164-1 as described in FIG. 7 through FIG. 9, the formation of and material of the patterned conductive layer 736 (e.g. 736-1 through 736-3) may be the same or similar to the process and material of forming the patterned conductive layer 166-1 as described in FIG. 8, and the formation of and material of the dielectric layer 738 may be the same or similar to the process and material of forming the dielectric layer 168 as described in FIG. 12.

However, the disclosure is not limited thereto; in certain embodiments, as shown in FIG. 20, the dielectric layer 732 (e.g., the dielectric layers 732-1 through 732-2) are dry film formed over the underneath layers/elements by limitation, while the material of the dielectric layer 738 is a photosensitive resin formed by the same method of forming the dielectric layer 168 as described in FIG. 12. In some embodiments, the dielectric layers 732-1 through 732-2 each further includes a filler to optimize coefficient of CTE thereof while the dielectric layer 738 include no filler. In such embodiments, the material of each of the dielectric layers 732-1 through 732-2 is different from the material of the dielectric layer 738. Owing to such configuration, the CTE mismatch between the interposer 700 and an element mounted thereto (e.g. a (semiconductor) package structure and/or a (semiconductor) circuit substrate) is greatly suppressed, thereby reducing the warpage (caused by the CTE mismatch) of the stacked package structure.

As shown in FIG. 20, in some embodiments, the surface-modifying film 750-1 is located between the dielectric layer 732-2 and the dielectric layer 738. The formation and material of the surface-modifying film 750-1 are the same or similar to the process and material of forming the surface-modifying film 150 as described in FIG. 4 through FIG. 5, and thus are not repeated herein for simplicity. In some embodiments, during the formation of the surface-modifying film 750-1, a —Si—O—C— bond is generated at a (bonding) interface between the surface-modifying film 750-1 and the dielectric layer 732-2. Due to the —Si—O—C— bond at the interfaces between the surface-modifying film 750-1 and the dielectric layer 732-2, the bonding strength between the surface-modifying film 750-1 and the dielectric layer 732-2 is greatly ensured. Owing the surface-modifying film 750-1 is sandwich between the dielectric layer 732-2 and the dielectric layer 738, the adhesion strength between the dielectric layer 732-2 and the dielectric layer 738 is significantly enhanced, thereby suppressing the delamination between the dielectric layer 732-2 and the dielectric layer 738.

In some embodiments, the redistribution circuit structure 740 includes a dielectric layer 742 (e.g. a dielectric layer 742-1 and a dielectric layer 742-2), a seed layer 744 (e.g. a seed layer 744-1, a seed layer 744-2, and a seed layer 744-3), a patterned conductive layer 746 (e.g. a patterned conductive layer 746-1, a patterned conductive layer 746-2 and a patterned conductive layer 746-3), and a dielectric layer 748. In some embodiments, as shown in FIG. 20, portions of an illustrated bottom surface of the patterned conductive layer 746-3 are respectively exposed by opening holes formed in the dielectric layer 748 for connecting with other conductive features (e.g. some of the bonding pads 760*b*), and portions of an illustrated top surface of the seed layer 744-1 are connecting with the vias 720. Through the redistribution circuit structure 740, some of the bonding pads 760*b* are electrically coupled to the vias 720 embedded in the core portion 710. As shown in FIG. 20, in some embodiments, the surface-modifying film 750-2 is located between the dielectric layer 742-2 and the dielectric layer 748. The formation and material of the surface-modifying film 750-2 are the same or similar to the formation and material of the surface-modifying film 750-1. In some embodiments, during the formation of the surface-modifying film 750-2, a —Si—O—C— bond is generated at a (bonding) interface between the surface-modifying film 750-2 and the dielectric layer 742-2. Due to the —Si—O—C— bond at the interfaces between the surface-modifying film 750-2 and the dielectric layer 742-2, the bonding strength between the surface-modifying film 750-2 and the dielectric layer 742-2 is greatly ensured. Owing the surface-modifying film 750-2 is sandwich between the dielectric layer 742-2 and the dielectric layer 748, the adhesion strength between the dielectric layer 742-2 and the dielectric layer 748 is significantly enhanced, thereby suppressing the delamination between the dielectric layer 742-2 and the dielectric layer 748.

In some embodiments, the redistribution circuit structure 740 is formed by the same method of forming the redistribution circuit structure 730 as described above, and thus are omitted for brevity.

In some embodiments, the bonding pads 760*a* are disposed on a surface of the redistribution circuit structure 730 and connected to the patterned conductive layer 736-3 exposed by the dielectric layers 738, while the bonding pads 760*b* are disposed on a surface of the redistribution circuit structure 740 and connected to the patterned conductive layer 746-3 exposed by the dielectric layers 748. The formations and methods of the bonding pads 760*a* and/or 760*b* may be the same or similar to the process and material of forming the seed-layer patterns 170 as described in FIG. 13 or the process and material of forming the UBM patterns u1 as described in FIG. 19, and thus are omitted herein. As shown in FIG. 20, some of the bonding pads 760*b* are electrically connected to some of the bonding pads 760*a* through the redistribution circuit structure 730, the vias 720 and the redistribution circuit structure 740.

In some embodiments, the conductive elements 770 are respectively formed on the bonding pads 760*b*. For example, the conductive elements 770 are electrically connected to the bonding pads 760*b*. In other words, the conductive elements 770 are electrically coupled to the interposer 700 through the bonding pads 760*b*. In some embodiments, through the bonding pads 760*b*, the redistribution circuit structure 740, the vias 720 and the redistribution circuit structure 730, some of the conductive elements 770 are electrically connected to some of the bonding pads 760*a*. The conductive elements 770 are, for example, micro-bump, chip connectors or BGA balls.

Referring to FIG. 21, in some embodiments, the package structure 10 and a substrate 500 are provided, where the package structure 10 is mounted to the interposer 700 through the conductive elements 180 and the interposer 700 is mounted to the substrate 500 through the conductive elements 770 to form a package structure having a stacked structure. The detail of the package structure 10 is described in FIG. 1 through FIG. 15, and thus are not repeated herein. In some embodiments, the package structure 10 is bonded to the interposer 700 through physically connecting the conductive elements 180 and the bonding pads 760*a* of the interposer 700 by flip chip bonding. Through the bonding pads 760*a* and the conductive elements 180, the semiconductor dies 120, 130 of the package structure 10 are electrically coupled to the interposer 700, for example. In other words, some of the conductive elements 770 are electrically connected to the semiconductor die 120, while some of the conductive elements 770 are electrically connected to the semiconductor die 130.

In some embodiments, the substrate 500 includes contact pads 510, contact pads 520, metallization layers 530, and vias (not shown). In some embodiments, the contact pads 510 and the contact pads 520 are respectively distributed on two opposite sides of the substrate 500 and are exposed for electrically connecting with later-formed semiconductor elements or conductive connectors. In some embodiments, the metallization layers 530 and the vias are embedded in the substrate 500 and together provide routing function for the substrate 500, where the metallization layers 530 and the vias are electrically connected to the contact pads 510 and the contact pads 520. That is, at least some of the contact pads 510 are electrically connected to some of the contact pads 520 through the metallization layers 530 and the vias, for example. In some embodiments, the contact pads 510 and the contact pads 520 include metal pads or metal alloy pads. In some embodiments, the materials of the metallization layers 530 and the vias may be substantially the same or similar to the material of the patterned conductive layer 166-1 as described in FIG. 8, and thus are not repeated herein for simplicity.

In some embodiments, as shown in FIG. 21, the interposer 700 is bonded to the substrate 500 through connecting the conductive element 770 and the contact pads 510 to form the package structure having a stacked structure, where the package structure 10 is electrically connected to the substrate 500 through the interposer 700. In some embodiments, the substrate 500 is referred to as a circuit substrate, such as an organic flexible substrate or a printed circuit board. In such embodiments, the conductive elements 180 are, for example, solder ball or BGA balls. The stacked package structure depicted in FIG. 21 may be formed by chip on wafer on substrate (CoWoS) packaging processes.

In some embodiments, an underfill 300 is optionally applied to fill the gap between the package structure 10 and the interposer 700 and wraps sidewalls of the conductive elements 180, which enhances the bonding strength between the package structure 10 and the interposer 700; thereby improving the reliability of the stacked package structure. In certain embodiments, the underfill 300 partially covers a sidewall SW4 of the package structure 10. Alternatively, the underfill 300 may be omitted. In some embodiments, an underfill 400 is optionally applied to fill the gap between the interposer 700 and the substrate 500 and wraps sidewalls of the conductive elements 770, which enhances the bonding strength between the interposer 700 and the substrate 500; thereby improving the reliability of the stacked package structure. In certain embodiments, the underfill 400 partially covers a sidewall SW5 of the interposer 700. Alternatively, the underfill 400 may be omitted.

The underfills 300 and 400 independently may be any acceptable material, such as a polymer, epoxy resin, molding underfill, or the like, for example. In one embodiment, the underfills 300 and 400 independently may be formed by underfill dispensing, a capillary flow process, or any other suitable method. In one embodiment, the material of the underfill 300 is different from the material of the underfill 400. In an alternative embodiment, the material of the underfill 300 is the same as the material of the underfill 400.

In some embodiments, a plurality of conductive terminals 600 are respectively formed on the substrate 500. As shown in FIG. 21, for example, the conductive terminals 600 are connected to the contact pads 520 of the substrate 500. In other words, the conductive terminals 600 are electrically connected to the substrate 500 through the contact pads 520. Through the contact pads 510 and the contact pads 520, some of the conductive terminals 600 are electrically connected to the package structure 10 (e.g. the semiconductor dies 120 and 130 included therein). In some embodiments, the conductive terminals 600 are, for example, solder balls or BGA balls. In such embodiments which of the stacked package structure as shown in FIG. 21, the conductive elements 180 are micro-bumps, the conductive elements 770 are chip connectors, and the conductive terminals 600 are solder balls or BGA balls. However, the disclosure is not limited thereto; in an alternative embodiment, the conductive terminals 600 may be omitted.

In accordance with some embodiments, a package structure includes a semiconductor die, an insulating encapsulation, a first redistribution circuit structure and a surface-modifying film. The semiconductor die has conductive terminals. The insulating encapsulation laterally encapsulates the semiconductor die and exposes the conductive terminals. The first redistribution circuit structure is located over the insulating encapsulation and electrically connected to the semiconductor die. The surface-modifying film is located on the insulating encapsulation and has a plurality of openings exposing edges of the conductive terminals, wherein the surface-modifying film separates the first redistribution circuit structure from the insulating encapsulation.

In accordance with some embodiments, a package structure includes a plurality of semiconductor dies, an insulating encapsulation, and a surface-modifying film. The plurality of semiconductor dies each have conductive terminals. The insulating encapsulation laterally encapsulates the plurality of semiconductor dies and exposes the conductive terminals. The surface-modifying film is located on the insulating encapsulation, wherein the surface-modifying film and the insulating encapsulation are bonded to each other through a Si—O—C bond.

In accordance with some embodiments, a method of manufacturing package structure includes the following steps, providing a semiconductor die having conductive terminals; laterally encapsulating the semiconductor die by an insulating encapsulation to expose the conductive terminals; forming a surface-modifying film on the insulating encapsulation to form an bonding interface having a Si—O—C bond between the insulating encapsulation and the surface-modifying film; forming a first redistribution circuit structure over the insulating encapsulation and electrically connecting to the semiconductor die through the conductive terminals, wherein the first redistribution circuit structure being separated from the insulating encapsulation by the surface-modifying film; and disposing conductive elements over the first redistribution circuit structure, wherein the first redistribution circuit structure is electrically coupled to and located between the conductive elements and the semiconductor die.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:

a semiconductor die, having conductive terminals and a protection layer covering sidewalls of the conductive terminals;

a first redistribution circuit structure, disposed over and electrically coupled to the semiconductor die; and a surface-modifying film, disposed between the first redistribution circuit structure and the semiconductor die, and having a plurality of openings exposing edges of the conductive terminals, wherein a bonding interface between the surface-modifying film and the protection layer comprises a Si—O—C bond, wherein a Si—O of the Si—O—C bond is included in the protection layer and a carbon of the Si—O—C bond bonded to the Si—O is included in the surface-modifying film.

2. The package structure of claim 1, further comprising:

an insulating encapsulation, laterally encapsulating the semiconductor die and exposing the conductive terminals, wherein the surface-modifying film separates the first redistribution circuit structure from the insulating encapsulation, and a bonding interface between the surface-modifying film and the insulating encapsulation comprises a Si—O—C bond.

3. The package structure of claim 2, wherein a material of the insulating encapsulation is different from a material of the surface-modifying film.

4. The package structure of claim 2, wherein a material of the insulating encapsulation comprises a filler, and wherein a thickness of the surface-modifying film is ranging from 1 nm to 20 nm.

5. The package structure of claim 2, wherein a surface of the protection layer is substantially leveled with top surfaces of the conductive terminals exposed by the insulating encapsulation, wherein the conductive terminals are free of the surface-modifying film.

6. The package structure of claim 5, wherein a material of the protection layer is different from a material of the surface-modifying film.

7. The package structure of claim 2, wherein:

the first redistribution circuit structure is further located over the insulating encapsulation, and the first redistribution circuit structure is separated from the insulating encapsulation through the surface-modifying film, wherein the first redistribution circuit structure comprises:

a dielectric layer, located on the insulating encapsulation and the semiconductor die, and comprising a plurality of contact openings exposing the conductive terminals exposed by the insulating encapsulation; and metallization features, located on the dielectric layer and further extend into the plurality of contact openings, wherein the metallization features are in contact with the conductive terminals exposed by the plurality of contact openings and the insulating encapsulation, wherein a first surface of the surface-modifying film physically contacts to the dielectric layer, a second surface of the surface-modifying film physically contacts to the insulating encapsulation, and the first surface is opposite to the second surface along a stacking direction of the first redistribution circuit structure and the insulating encapsulation.

8. The package structure of claim 7, wherein a material of the dielectric layer is different from a material of the surface-modifying film and is different from a material of the insulating encapsulation.

9. The package structure of claim 2, further comprising:

a sealing element, embedded in the first redistribution circuit structure and electrically isolated from the semiconductor die, wherein a positioning location of the sealing element is offset from a positioning location of the semiconductor die in a vertical projection along a stacking direction of the first redistribution circuit structure and the insulating encapsulation.

10. A semiconductor device, comprising:

a package structure as claimed in claim 1; and an interposer, comprising:

a core substrate, having conductive vias penetrating therethrough;

a second redistribution circuit structure, located on the core substrate and electrically coupled to the conductive vias, wherein the second redistribution circuit structure comprising a plurality of dielectric layers and a plurality of metallization layers arranged in alternation;

under-ball metallurgy patterns, located over a topmost layer of the dielectric layers, wherein the second redistribution circuit structure is located between the core substrate and the under-ball metallurgy patterns; and another surface-modifying film, located between the topmost layer of the dielectric layers and another dielectric layer of the dielectric layers being immediately underlying the topmost layer of the dielectric layers, wherein a bonding interface between the another surface-modifying film and the another dielectric layer comprises a Si—O—C bond, wherein the package structure is mounted on and electrically connected to the interposer through the under-ball metallurgy patterns.

11. The semiconductor device of claim 10, wherein a material of the topmost layer of the dielectric layers is different from a material of the another dielectric layer of the dielectric layers.

12. A package structure, comprising:

a plurality of semiconductor dies, having conductive terminals and a protection layer covering sidewalls of the conductive terminals;

an insulating encapsulation, laterally encapsulating the plurality of semiconductor dies and exposing the conductive terminals; and a surface-modifying film, disposed on the insulating encapsulation, wherein the surface-modifying film and the protection layer are bonded to each other through a Si—O—C bond, wherein a Si—O of the Si—O—C bond is included in the protection layer and a carbon of the Si—O—C bond bonded to the Si—O is included in the surface-modifying film.

13. The package structure of claim 12, wherein a material of the insulating encapsulation is different from a material of the surface-modifying film, and a bonding interface between the surface-modifying film and the insulating encapsulation comprises a Si—O—C bond.

14. The package structure of claim 12, further comprising:

a redistribution circuit structure, located over the insulating encapsulation and electrically connected to the plurality of semiconductor dies;

a plurality of conductive elements, located on the redistribution circuit structure, wherein the redistribution circuit structure is located between and electrically connected to the plurality of conductive elements and the plurality of semiconductor dies; and a sealing element, embedded in the redistribution circuit structure and electrically isolated from the plurality of semiconductor dies, wherein the sealing element is in contact with the surface-modifying film.

15. The package structure of claim 12, further comprising:

a redistribution circuit structure, located over the insulating encapsulation and electrically connected to the plurality of semiconductor dies;

a plurality of conductive elements, located on the redistribution circuit structure, wherein the redistribution circuit structure is located between and electrically connected to the plurality of conductive elements and the plurality of semiconductor dies; and a sealing element, embedded in the redistribution circuit structure and electrically isolated from the plurality of semiconductor dies, wherein the sealing element is free from the surface-modifying film.

16. The package structure of claim 12, wherein the plurality of semiconductor dies comprise a first semiconductor die and a second semiconductor die electrically connected thereto, wherein one of the first semiconductor die and the second semiconductor die is a memory stack die and other one of the first semiconductor die and the second semiconductor die is a logic processor die.

17. A method of manufacturing a package structure, comprising:

providing a semiconductor die having conductive terminals and a protection layer covering sidewalls of the conductive terminals;

forming a surface-modifying film on the semiconductor die to form a bonding interface having a Si—O—C bond between the protection layer and the surface-modifying film, wherein a Si—O of the Si—O—C bond is included in the protection layer and a carbon of the Si—O—C bond bonded to the Si—O is included in the surface-modifying film;

forming a first redistribution circuit structure over the semiconductor die and electrically connecting to the semiconductor die through the conductive terminals, edges of the conductive terminals being exposed by the plurality of openings formed in the surface-modifying film, wherein the first redistribution circuit structure is separated from the protection layer by the surface-modifying film, and the surface-modifying film is disposed between the first redistribution circuit structure and the semiconductor die; and disposing conductive elements over the first redistribution circuit structure, wherein the first redistribution circuit structure is electrically coupled to and disposed between the conductive elements and the semiconductor die.

18. The method of claim 17, wherein forming the surface-modifying film on the semiconductor die comprises:

applying a surface-modifying solution composition over the semiconductor die, where the surface-modifying solution composition comprises a solvent and a first compound selected from the group consisting of a compound having a structure unit represented by chemical formula (1), a compound having a structure unit represented by chemical formula (2), a compound having a structure unit represented by chemical formula (3), a compound having a structure unit represented by chemical formula (4), a compound having a structure unit represented by chemical formula (5), and a compound having a structure unit represented by chemical formula (6), chemical formula (1)

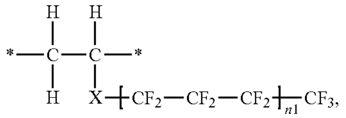

chemical formula (2)

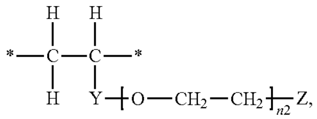

chemical formula (3)

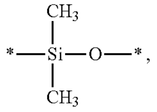

chemical formula (4)

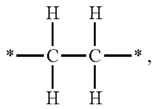

chemical formula (5)

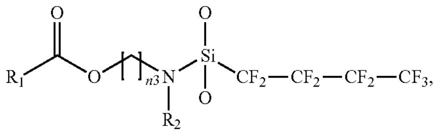

and chemical formula (6)

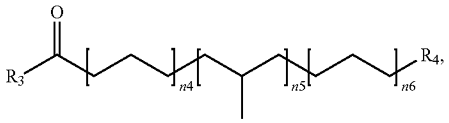

wherein:

$R_1$ represents —$CH_3$, —$CH_2CH_3$ or —$CH_2CH_2NH_2$;

$R_2$ represents a hydrogen atom, —$CH_3$ or —$CH_2CH_3$;

$R_3$ represents-$CH_3$, —$CH_2CH_3$ or —$CH_2CH_2NH_2$;

$R_4$ represents-$CH_3$, —$OCH_3$, —$CH_2CH_3$, —$OCH_2CH_3$ or —$CH_2CH_2NH_2$;

X represents-($CH_2$)—, —($SO_2$)—, —(NH)—, —($NR_5$)—, a hydrogen atom, a substituted or unsubstituted alkyl chain having a linear-like structure, a branch-like structure, a comb-like structure or a star-like structure, a substituted or unsubstituted alkylene group, or an aromatic ring, wherein $R_5$ represents-$CH_3$, —$CH_2CH_3$ or —$CH_2CH_2NH_2$;

Y represents —($CH_2$)—, —($SO_2$)—, —(NH)—, —($NR_6$)—, a hydrogen atom, a substituted or unsubstituted alkyl chain having a linear-like structure, a branch-like structure, a comb-like structure or a star-like structure, a substituted or unsubstituted alkylene group, or an aromatic ring, wherein $R_6$ represents-$CH_3$, —$CH_2CH_3$ or —$CH_2CH_2NH_2$;

Z represents a hydrogen atom, —($COOR_7$), —($R_8$—$CH_3$), or —(($CH_2$)$_{n7}$)—$CH_3$, wherein $R_7$ represents —$CH_3$, —$CH_2CH_3$ or —$CH_2CH_2NH_2$, and $R_8$ represents ($CH_2$)— or —($OCH_2$)—; and n1, n2, n3, n4, n5, n6 and n7 independently are an integer of 1-10000;

performing a thermal treatment on the surface-modifying solution composition, wherein the surface-modifying solution composition and the protection layer of the semiconductor die are subjected to form a Si—O—C bond therebetween by dehydration so as to form the surface-modifying film on the protection layer; and removing a part of the surface-modifying solution composition un-bonding to the protection layer by rinsing.

19. The method of claim 17, prior to forming the surface-modifying film on the semiconductor die and after providing the semiconductor die, further comprises:

laterally encapsulating the semiconductor die by an insulating encapsulation to expose the conductive terminals and the protection layer, wherein forming the surface-modifying film on the semiconductor die to form the bonding interface having a Si—O—C bond between the protection layer and the surface-modifying film further comprises forming the surface-modifying film on the insulating encapsulation to form a bonding interface having a Si—O—C bond between the insulating encapsulation and the surface-modifying film, and comprises:

applying a surface-modifying solution composition over the insulating encapsulation and the semiconductor die, where the surface-modifying solution composition comprises a solvent and a first compound selected from the group consisting of a compound having a structure unit represented by chemical formula (1), a compound having a structure unit represented by chemical formula (2), a compound having a structure unit represented by chemical formula (3), a compound having a structure unit represented by chemical formula (4), a compound having a structure unit represented by chemical formula (5), and a compound having a structure unit represented by chemical formula (6), chemical formula (1)

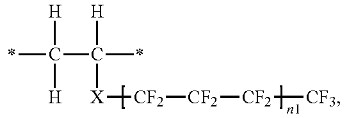

chemical formula (2)

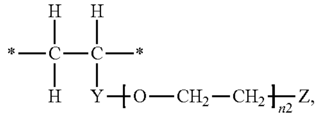

chemical formula (3)

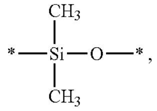

-continued chemical formula (4)

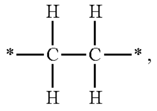

chemical formula (5)

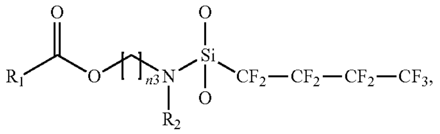 and chemical formula (6)

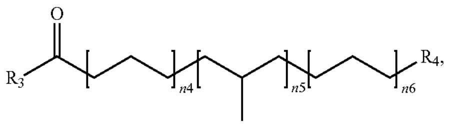

wherein:

$R_1$ represents-$CH_3$, —$CH_2CH_3$ or —$CH_2CH_2NH_2$;

$R_2$ represents a hydrogen atom, —$CH_3$ or —$CH_2CH_3$;

$R_3$ represents-$CH_3$, —$CH_2CH_3$ or —$CH_2CH_2NH_2$;

$R_4$ represents-$CH_3$, —$OCH_3$, —$CH_2CH_3$, —$OCH_2CH_3$ or —$CH_2CH_2NH_2$;

X represents —($CH_2$)—, —($SO_2$)—, —(NH)—, —($NR_5$)—, a hydrogen atom, a substituted or unsubstituted alkyl chain having a linear-like structure, a branch-like structure, a comb-like structure or a star-like structure, a substituted or unsubstituted alkylene group, or an aromatic ring, wherein $R_5$ represents-$CH_3$, —$CH_2CH_3$ or —$CH_2CH_2NH_2$;

Y represents —($CH_2$)—, —($SO_2$)—, —(NH)—, —($NR_6$)—, a hydrogen atom, a substituted or unsubstituted alkyl chain having a linear-like structure, a branch-like structure, a comb-like structure or a star-like structure, a substituted or unsubstituted alkylene group, or an aromatic ring, wherein $R_6$ represents-$CH_3$, —$CH_2CH_3$ or —$CH_2CH_2NH_2$;

Z represents a hydrogen atom, —($COOR_7$), —($R_8$—$CH_3$), or —($(CH_2)_{n7}$)—$CH_3$, wherein $R_7$ represents-$CH_3$, —$CH_2CH_3$ or —$CH_2CH_2NH_2$, and $R_8$ represents —($CH_2$)— or —($OCH_2$)—; and n1, n2, n3, n4, n5, n6 and n7 independently are an integer of 1-10000;

performing a thermal treatment on the surface-modifying solution composition, wherein the surface-modifying solution composition and the protection layer of the semiconductor die are subjected to form a Si—O—C bond therebetween by dehydration so as to form a part of the surface-modifying film on the protection layer, and the surface-modifying solution composition and the insulating encapsulation are subjected to form a Si—O—C bond therebetween by dehydration so as to form other part of the surface-modifying film on the insulating encapsulation; and removing a part of the surface-modifying solution composition un-bonding to the insulating encapsulation and the protection layer by rinsing.

20. A method of manufacturing a semiconductor device, comprising:

forming a package structure via a method as claimed in claim 17;

providing an interposer, comprising:

a core substrate, having conductive vias penetrating therethrough;

a second redistribution circuit structure, located on the core substrate and electrically coupled to the conductive vias, wherein the second redistribution circuit structure comprising a plurality of dielectric layers and a plurality of metallization layers arranged in alternation;

under-ball metallurgy patterns, located over a topmost layer of the dielectric layers, wherein the second redistribution circuit structure is located between the core substrate and the under-ball metallurgy patterns; and another surface-modifying film, located between the topmost layer of the dielectric layers and another dielectric layer of the dielectric layers being immediately underlying the topmost layer of the dielectric layers, wherein a bonding interface between the another surface-modifying film and the another dielectric layer comprises a Si—O—C bond; and mounting the package structure on the interposer through the under-ball metallurgy patterns and the conductive elements, the package structure electrically coupling to the interposer.

* * * * *